United States Patent
Schaer

(10) Patent No.: US 9,864,822 B2
(45) Date of Patent: Jan. 9, 2018

(54) METHOD FOR THE DETERMINATION OF WORKPIECE TRANSPORT TRAJECTORIES IN A MULTIPLE STATION PRESS

(71) Applicant: Guedel Group AG, Langenthal (CH)

(72) Inventor: Dominique Schaer, Basel (CH)

(73) Assignee: GUEDEL GROUP AG, Langenthal (CH)

( * ) Notice: Subject to any disclaimer, the term of this patent is extended or adjusted under 35 U.S.C. 154(b) by 343 days.

(21) Appl. No.: 14/437,276

(22) PCT Filed: Oct. 22, 2013

(86) PCT No.: PCT/CH2013/000181
§ 371 (c)(1),
(2) Date: Apr. 21, 2015

(87) PCT Pub. No.: WO2014/063262
PCT Pub. Date: May 1, 2014

(65) Prior Publication Data
US 2015/0294044 A1    Oct. 15, 2015

(30) Foreign Application Priority Data

Oct. 22, 2012  (CH) .................................. 2068/12

(51) Int. Cl.
*G06F 19/00* (2011.01)
*G06F 17/50* (2006.01)
(Continued)

(52) U.S. Cl.
CPC ......... *G06F 17/5009* (2013.01); *B21D 43/05* (2013.01); *B25J 9/1666* (2013.01);
(Continued)

(58) Field of Classification Search
USPC .............................................. 700/112; 703/2
See application file for complete search history.

(56) References Cited

U.S. PATENT DOCUMENTS 5,017,073 A * 5/1991 Strasser ................ C23C 14/566
                                                    414/217
5,655,060 A * 8/1997 Lucas .................... B25J 9/1664
                                                    318/560
(Continued)

FOREIGN PATENT DOCUMENTS

DE    199 44 607 A1    3/2001
EP    1 615 090 A1     1/2006
(Continued)

OTHER PUBLICATIONS

European Office Action dated Oct. 25, 2017 received in corresponding EP Application No. 13 783 829.8.

*Primary Examiner* — Kidest Bahta
(74) *Attorney, Agent, or Firm* — Birch, Stewart, Kolasch & Birch, LLP

(57) ABSTRACT

A method for the determination of workplace transport trajectories in a multiple station press, comprises the steps of providing a set of constraints for the workplace transport trajectories, the constraints comprising at least pickup and deposit positions for a workplace in a plurality of stations of the multiple station press, providing machine properties of the plurality of stations and of at least one transfer device for transporting the workplace from a first of the plurality of stations to a second of the plurality of stations, providing information on a candidate workplace transport trajectory, simulating the plurality of stations and the at least one transfer device based on the provided information for determining whether the candidate workplace transport trajectory conforms with the provided machine parameters, and displaying the result of the determination.

25 Claims, 16 Drawing Sheets

(51) Int. Cl.
  *B21D 43/05* (2006.01)
  *B25J 9/16* (2006.01)
  *G05B 19/418* (2006.01)
  *G06F 17/10* (2006.01)
(52) U.S. Cl.
  CPC ....... *G05B 19/41825* (2013.01); *G06F 17/10* (2013.01); *G05B 2219/39105* (2013.01); *G05B 2219/40395* (2013.01); *G05B 2219/40421* (2013.01); *G05B 2219/43176* (2013.01); *G05B 2219/45142* (2013.01); *Y02P 90/087* (2015.11); *Y02P 90/26* (2015.11)

(56) References Cited

U.S. PATENT DOCUMENTS

| | | | | |
|---|---|---|---|---|
| 5,968,297 | A | * | 10/1999 | Hooker ................ A43D 25/183 118/669 |
| 6,002,971 | A | * | 12/1999 | Lucas ................... B25J 9/1664 700/213 |
| 6,662,067 | B1 | | 12/2003 | Xu et al. |
| 2003/0180137 | A1 | * | 9/2003 | Schuster ................ B23Q 7/04 414/746.3 |
| 2005/0067995 | A1 | | 3/2005 | Weinhofer et al. |
| 2008/0109105 | A1 | | 5/2008 | Weber et al. |
| 2010/0234994 | A1 | * | 9/2010 | Shi ........................ B25J 9/1697 700/258 |

FOREIGN PATENT DOCUMENTS

| | | |
|---|---|---|
| EP | 1 815 972 A2 | 8/2007 |
| JP | 2003-245800 A | 9/2003 |
| JP | 2006-116583 A | 5/2006 |
| JP | 2006-122986 A | 5/2006 |
| JP | 2009-22996 A | 2/2009 |
| WO | WO 00/73967 A1 | 12/2000 |
| WO | WO 2005/051563 A1 | 6/2005 |
| WO | WO 2012/055916 A1 | 5/2012 |

\* cited by examiner

Fig. 18

| Off Limit | Name | Location |
|---|---|---|
| ✓ | SUMMARY | |
| ☐ | Cam Degrees in Home | - |
| ✓ | Y1-Axis : Position Max | LO-In (92°) |
| ☐ | Y1-Axis : Position Min | - |
| ☐ | Y1-Axis : Gearbox Rot. Speed | - |
| ☐ | Y1-Axis : Gearbox Torque | - |
| ☐ | Y1-Axis : Gearbox RMS Torque | - |
| ☐ | Y1-Axis : Motor Rot. Speed | - |
| ☐ | Y1-Axis : Motor Torque | - |
| ☐ | Y1-Axis : Motor RMS Torque | - |
| ☐ | Z1-Axis : Position Max | - |
| ☐ | Z1-Axis : Position Min | - |
| ☐ | Z1-Axis : Spindle Dyn. Force | - |
| ☐ | Z1-Axis : Motor Rot. Speed | - |
| ☐ | Z1-Axis : Motor Torque | - |
| ☐ | Z1-Axis : Motor RMS Torque | - |
| ☐ | Z2-Axis : Position Max | - |
| ☐ | Z2-Axis : Position Min | - |
| ☐ | Z2-Axis : Spindle Dyn. Force | - |
| ☐ | Z2-Axis : Motor Rot. Speed | - |

Fig. 19

METHOD FOR THE DETERMINATION OF WORKPIECE TRANSPORT TRAJECTORIES IN A MULTIPLE STATION PRESS

TECHNICAL FIELD

The invention relates to a method for the determination of workpiece transport trajectories in a multiple station press. The invention further relates to software for implementing the method.

BACKGROUND ART

Today, multi-station presses, i. e. arrangements of at least two presses arranged in succession, in such a way that workpieces worked on by the first of the presses may be handed over to the second press (directly or employing an intermediate station) are widely used in a variety of applications such as e. g. sheet forming for the production of car bodies. In the following, "multi station press" is understood to include tandem presses, press lines, etc.

Usually, the handing over of the work pieces from a press station to the next one is effected by automatic handling devices. The throughput of a multi station press is not only defined by the speed of the press stations (i. e. strokes per minute) but also by the efficiency of the deposition and removal of workpieces and the transport of the workpieces between the presses. Technically, a large number of different systems for transporting workpieces from station to station are available, having different kinematics involving e. g. linear and/or swivel axes. An example out of many is described in WO 2005/051563 A1 (Güde Group AG). Choosing the appropriate system, in principle very high transport speeds are achievable.

However, todays versatile and fast transport devices often provide much freedom in choosing the trajectory for transporting the workpiece from one station to the next one. In the following, the term "trajectory" is understood to be the path of an object through space as a function of time. It does not only include the geometry of the path, but also the position of the object along the path as a function of time. The trajectories discussed in this document are closed, i. e. the same path is usually ran through repeatedly.

The freedom in chasing the trajectory allows for optimizing the operation of the multi-station press. However, it is not a simple task to define the trajectory such that a high or even optimum throughput of the whole system is achieved. Either the user is provided with limited possibilities of influencing the trajectory, which can mean that the optimum trajectory cannot be generated in any case, or the parameters to be defined are so many that parameterizing the trajectory amounts to a complex and lengthy task which can only be handled by very experienced operators and which involves a lot of trial and error.

SUMMARY OF THE INVENTION

It is therefore the object of the invention to create a method pertaining to the technical field initially mentioned, that facilitates the determination of workpiece transport trajectories that allow for high throughput.

The solution of the invention is specified by the features of claim 1. According to the invention, the method for the determination of workpiece transport trajectories in a multiple station press comprises the steps of a) providing a set of constraints for the workpiece transport trajectories, the constraints comprising at least pickup and deposit positions for a workpiece in a plurality of stations of the multiple station press;

b) providing machine properties of the plurality of stations and of at least one transfer device for transporting the workpiece from a first of the plurality of stations to a second of the plurality of stations;

c) providing information on a candidate workpiece transport trajectory;

d) simulating the plurality of stations and the at least one transfer device based on the provided information for determining whether the candidate workpiece transport trajectory conforms with the provided machine parameters;

e) displaying the result of the determination.

The machine properties may include various parameters of the stations and the transfer device of the multiple station press, such as one or a plurality of the following:

a) maximum velocities of machine and/or geometric axes of the transport system;

b) maximum accelerations of machine and/or geometric axes of the transport system;

c) maximum velocities of a workpiece transported by the transfer device;

d) maximum accelerations of a workpiece transported by the transfer device; and/or e) a press stroke rate of the plurality of stations.

In general, the constraints for the trajectories such as pickup and deposit positions are given by the general set-up of the multiple station press, the transfer device, the workpiece and the press tools. Remaining degrees of freedom in defining the workpiece transport trajectory may be influenced by the user (and/or the system carrying out the method) in order to optimize the trajectory with respect to throughput, minimum wear of components, etc. It is to be noted that the very same parameter may be a constraint on the trajectory in one case whereas it is a degree of freedom that can be varied by the user when providing information on a candidate trajectory in another case, which e. g. employs another transfer device, another workpiece, or press stations with additional degrees of freedom. Further constraints or degrees of freedom may include e. g. a null position of the workpiece or other parameters described in more detail below.

Generally, the constraints, the degrees of freedom for defining the trajectory and the candidate trajectory itself include information on any of the machine and/or geometric axes that amount to the transport of the workpiece, i. e. a trajectory may be e. g. defined by a (temporal) succession of sets of positions of a plurality of axes.

A trajectory is understood to conform with the provided machine parameters if it is physically possible to transport the workpiece along the trajectory, e. g. without collisions between the transported workpiece and the press tools or neighboring workpieces, and if certain limits of the components of the elements of the multi station press and the transfer device (such as maximum velocities, accelerations, moments, etc.) are not exceeded. In principle, the simulation of the plurality of stations and the at least one transfer device includes all actions of these components that are relevant for determining whether the candidate trajectory conforms with the machine parameters. As an example, in the context of the simulation the position, velocity, acceleration and further relevant parameters for the relevant components of the workpiece, stations and transfer device are determined for a succession of point in time, essentially covering the repeated cycle. For any of these points in time it is checked whether there is a conflict between two or more of these components and whether (upper and/or lower) limits with respect to the position, velocity, acceleration or other relevant parameters are exceeded.

Displaying the result of the determination may include methods such as text and/or graphics output on a screen, paper printout, speech output or using any other available method for conveying information to a human user. In the most simple embodiment, the output is binary, i. e. whether the candidate workpiece trajectory conforms with the machine parameters or not. However, usually it is advantageous to provide a more comprehensive output, facilitating the creation of an improved candidate trajectory.

The inventive method allows for facilitating the generation and testing of candidate trajectories. By including technical considerations relating to the build-up of the multiple station press and the transfer device into the method of determining workpiece transport trajectories, the process of optimizing the workpiece transport trajectory is simplified and made more efficient.

The method may include the further step of exporting the data relating to an elected trajectory considered to be suitable for the given task. The exported data may be used to control the multiple station press and/or transport devices thereof. Furthermore, the method may be carried out directly on the controller of a multiple station press or a transport system, such that the data on the elected trajectory may be immediately used for controlling the respective system.

The method may be realized by utilizing software that comprises software code portions for implementing the inventive method. In principle, the software may be run on an all-purpose personal computer, on dedicated hardware such as in particular the multiple station press controller, or on other suitable equipment.

Accordingly, the invention further encompasses an arrangement or system comprising a multiple station press, at least one transfer device for transporting the workpiece from a first of the plurality of stations to a second of the plurality of stations and a controller for the transfer device, wherein the controller accepts and stores a set of constraints for the workpiece transport trajectories, the constraints comprising at least pickup and deposit positions for the workpiece in a plurality of stations of the multiple station press, wherein the controller accepts and stores machine properties of the plurality of stations and of the at least one transfer device, wherein the controller accepts and stores information on a candidate workpiece transport trajectory, wherein the controller is adapted to simulate the plurality of stations and the at least one transfer device based on the stored information for determining whether the candidate workpiece transport trajectory conforms with the stored machine parameters; and wherein the arrangement comprises means for displaying the result of the determination.

Preferably, the method comprises the further step of providing information on a press tool geometry of the plurality of stations and/or a workpiece geometry, wherein the simulation step includes a determination of whether the candidate workpiece transport trajectory conforms with the provided press tool and/or workpiece geometry.

This allows for automatically checking the conformance taking into the account the actual workpiece that will be processed (if required, modifications of the shape of the workpiece effected by the preceding presses may as well be accounted for).

Alternatively or in addition, the information on the press tool and/or workpiece geometry is provided, and the path corresponding to the candidate workpiece trajectory is displayed together with the extension of the press tool and/or workpiece in a graphical representation. This allows for visually check whether there is a conflict between the workpiece and the press tool when the candidate workpiece transport trajectory is chosen. In this case, the workpiece path is preferably displayed in the coordinates of the moved tool of the press (i. e. usually the upper die). Doing so, the extension of the workpiece is a static area of the graphical representation and conflicts with the path can be easily detected at first glance.

Preferably, the workpiece transport trajectories and the candidate workpiece transport trajectory are parameterized by a plurality of positions of a plurality of axes as a function of an angle parameter. Usually, the transport device for transporting the workpiece features a number of device axes that are controlled by a corresponding control system (e. g. PLC or NC controller). These device axes (e. g. drive positions) relate to certain geometrical axes (e. g. XYZ position of a certain reference point of the workpiece or workpiece gripper, rotations). Due to the closed nature of the trajectory, all these axes may be expressed in coordinates that relate to the operation cycle of the press. Usually, a whole cycle is partitioned into 360° and the positions of the axes of the press and of the transport device are expressed in the corresponding angle coordinates. This makes it easier to relate the operation of the transport device to that of the neighboring presses.

Alternatively, the trajectories are parameterized as a function of a different parameter that is not directly related to the press cycle, e. g. time.

Preferably, the workpiece transport trajectories and the candidate workpiece transport trajectory are partitioned into a plurality of segments, each of the segments including the axes positions for a continuous range of values of the angle parameter. The segments make it easier to work with the trajectories as explained further below. Preferably, for each axis the trajectory of this axis in a given segment is generally represented by a continuous function assigning the position of the axis to any value of the angle parameter in the mentioned range.

Advantageously, a first of the segments relates to unloading a workpiece from a pickup position and a second of the segments relates to loading a workpiece in a deposition position. This allows for decoupling the loading and unloading phases where there is possible interference with the presses from each other and possibly from further phases of workpiece transport.

In this respect, it is preferred to have at least a third segment connecting an end of the first segment to a start of the second segment and at least a fourth segment connecting an end of the second segment to a start of the first segment. This provides degrees of freedom for adjusting the workpiece transport trajectory in order to optimize the transport process.

These measures allow for decoupling the loading side from the unloading side. Further segments are possible, e. g. in order to separate the moving-in from the moving-out phases of loading and unloading, respectively, or in order to provide yet further degrees of freedom.

In a preferred embodiment, the information on the candidate workpiece transport trajectory comprises at least one shift parameter, wherein the shift parameter relates to a temporal offset of at least one segment of the candidate workpiece transport trajectory. This means that a segment or a group of connected segments may be delayed or forwarded with respect to the action of the neighboring presses. If required, the neighboring segments are adapted in such a way that there are no discontinuities or strokes at the transition between the shifted and the unshifted segments.

A segment including the axis positions of a plurality of axes, shifting in particular affects a plurality of axes simultaneously, i. e. the path of the workpiece remains unchanged, but the position of the workpiece on the path as a function of time will be influenced.

Advantageously, the at least one shift parameter comprises an unloading shift parameter and a loading shift parameter for delaying or forwarding a running through an unloading or a loading segment, respectively. Using these shift parameters, the user is able to specifically control the loading and/or unloading phase of the workpiece transport in order to avoid collisions with the press tools.

Shifting inter alia allows for decoupling the trajectory with respect to collisions with the lower die and the upper die, respectively.

Advantageously, the at least one shift parameter comprises a general motion shift parameter for delaying or forwarding a running through a complete succession of segments constituting the candidate workpiece transport trajectory. This allows inter alia for adapting the workpiece transport trajectory to the action of the neighboring presses, i.e. for synchronizing the transfer device with the preceding and/or subsequent press station.

Preferably, the plurality of segments comprises at least one velocity-to-velocity segment, the velocities at a beginning and at an end of the segment being predetermined and non-zero. Not requiring that the velocity in a segment needs to be zero at the transitions with the neighboring segments provides for additional degrees of freedom and allows for optimizing the trajectory with respect to throughput. As mentioned further below, additional types of segments are possible.

In a preferred embodiment, the information on the candidate workpiece transport trajectory comprises a motion scaling parameter, wherein the motion scaling parameter is a scaling factor for proportionally scaling a start and stop of segments in angle parameters. Again, influencing the plurality of axes of the segments alike, scaling the segments will have no influence on the path of the workpiece, but the position of the workpiece on the path as a function of time will be influenced.

This allows inter alia the decoupling of the feeder speed from the line speed.

The motion scaling may affect a single one, several or all of the segments. Furthermore, it is possible to have more than one scaling parameter, the different parameters affecting different segments or different sets of segments, respectively. Preferably, the motion scaling is applied in such a way that the relative shifts of the segments neighboring the scaled segment(s) do not need to be adjusted, independent from the scaling parameter. Doing so, the interference of the transport device and the press is not influenced, as long as the corresponding segments are not directly affected by the motion scaling.

In a further preferred embodiment, the information on the candidate workpiece transport trajectory comprises a set of motional information and values of angle parameters relating to transitions between neighboring segments of a set of segments of a trajectory template, the motional information at least comprising velocity information. The transition between two segments may happen at rest or at a predetermined velocity (which corresponds to the velocity at the end of the preceding segment).

In particular, the method allows for entering information on different levels:
1. basic constraints, shifts and scaling,
2. segment transitions,
3. details of the segments themselves.

The choice between levels of different complexit allows for getting optimum results due to ease of use without compromise on the performance. The level of complexity is reduced at the user's option. In principle, in a first phase the main characteristics of a trajectory may be determined by providing the required information on the simplest level, i.e. level 1, and the higher levels are employed in a second phase to further optimize the trajectory. Depending on his or her experience the user may decide not to employ level 3 at all.

Preferably, the trajectory template comprises a plurality of segments chosen from the following types of segments:
a) standstill-to-standstill;
b) standstill-to-velocity;
c) velocity-to-standstill;
d) velocity-to-velocity;
e) standstill-to-standstill with limited velocity.

The choice between these types of segments allows for precisely defining a workpiece transport trajectory. Further types of segments are possible.

Preferably, the trajectory template comprises a first segment type, the trajectory of which being parameterized by a polynomial of a first order, and a second segment type, the trajectory of which being parameterized by a polynomial of a second order, the first order being different from the second order. Suitable orders are e. g. $5^{th}$ and $7^{th}$ order. $5^{th}$ order polynomials are known to be suitable for modeling portions of workpiece transport paths. Using a higher order polynomial provides additional degrees of freedom and thereby additional possibilities when parameterizing a trajectory.

Instead or in addition of polynoms, segments may be defined by other functions such as e. g. different kinds of splines or sine functions. It is possible to have a trajectory that is composed of a number of segments based on different kinds of functions, which allows to increase the degrees of freedom. Different sets of trajectory templates may be made available to users having different levels of experience.

It is to be noted that a trajectory may include segments of different types, even for the parametrization of the same axis. As long as the transition between neighboring segments is smooth, the combination of e. g. polynomial segments of different order and/or spline or sine function segments does not cause problems within the inventive framework.

Furthermore, it is possible to have segments which are not symmetric in time with respect to the acceleration and deceleration. In particular, this allows for specifically taking into account the influence of gravity within single segments.

Preferably, the information on the candidate workpiece transport trajectory comprises a move in and/or a move out stroke of an unloading and/or a loading path. This allows for easily adjusting the trajectory in the vicinity of picking up or depositing a workpiece, dependent on the press tool and workpiece geometry, without tampering with the adjoining sections of the workpiece trajectory.

In a preferred embodiment, at least one of the plurality of stations is a servo press, wherein the machine properties of the plurality of stations comprise information on a maximum velocity, acceleration and/or maximum force allowed on the servo press and preferably information on a maximum power consumption allowed for the servo press.

Servo presses provide additional degrees of freedom, in that the movements of the press slide may be controlled in much more detail than those in conventional presses. In principle, these additional degrees of freedom may be exploited when optimizing the performance of the whole system. However, at the same time, the complexity of the task is also considerably increased. Accordingly, it is preferred that the method supports the user in determining not only the workpiece transport but also the servo press trajectory, i. e. the movement of the press slide.

Accordingly, the method preferably comprises the step of providing information on a candidate servo press trajectory, wherein the simulation of the plurality of stations and the at least one transfer device includes a simulation of the servo press operated according to the provided candidate servo press trajectory.

Preferably, the information on the candidate servo press trajectory comprises at least one of the following:
a) a deep draw height;
b) a deep draw velocity profile;
c) a deep draw energy profile.

Usually, these parameters are predetermined, based on the processing step applied to the workpiece, i. e. these parameters relate to basic conditions that should be met for any of the candidate servo press trajectories.

Preferably, the simulation of the plurality of stations and the at least one transfer device includes a simulation of a dynamical model of the servo press, taking into account moving masses and corresponding inertia and a maximum slide velocity.

This ensures that the resulting work piece and servo press trajectories meet the requirements with respect to certain limits of the components of the elements of the servo press, the work piece and the transfer device (such as maximum velocities, accelerations, moments, etc.) and that no collisions between the elements occur.

Preferably, the simulation of the plurality of stations and the at least one transfer device includes a simulation of an electrical model of the servo press, taking into account a maximum motor velocity, a maximum torque, a maximum current and/or power consumption. This allows for taking into account not only mechanical considerations but also considerations with respect to the energy consumption and electrical limits of the servo press motor. Furthermore, as described below, this allows for more precisely controlling the actual servo press.

Preferably, the information on the candidate servo press trajectory comprises at least one parameter for adjusting the candidate servo press trajectory, wherein the parameter affects the trajectory in such a way that a deep draw velocity profile is unchanged. This allows for defining the most appropriate deep draw velocity profile in a first step, e. g. by defining corresponding segments of the press trajectory. The remaining degrees of freedom may then be exploited in a second step, by variation of the at least one parameter, in order to optimize the throughput of the station and associated feeder and/or the whole multiple station press.

Preferably, the simulation of the plurality of stations and the at least one transfer device comprises a simulation of energy management involving the plurality of stations and/or the at least one transfer device.

The energy consumption of the transfer devices and the presses greatly vary along the respective press cycle. Accordingly, if two or more transfer devices and/or presses of a multiple station press are at their energy maximum at the same time the power load of the multiple station press rises considerably. In order to limit the maximum electrical power that needs to be provided to the multiple station press, it is therefore necessary to manage the energy consumption of the plurality of presses and/or the transfer devices. This process may be supported by the simulation of the energy management based on the provided properties of the presses and/or the transfer devices.

Preferably, the multiple station press comprises a plurality of servo presses and the simulation of energy management involves the plurality of servo presses.

Alternatively, the simulation of energy management includes standard mechanical or hydraulic presses, or it is limited to the transfer devices.

Preferably, the method comprises the step of generating a progression of current values for controlling operation of the servo press, based on the simulation of the servo press and preferably the at least one transfer device. These current values may be fed to the controller of the multiple station press or the controller of the given servo press, respectively. It will allow for precisely controlling the servo press with a reduced need for corrections that are usually required when the position of the slide is controlled based exclusively on a position feedback.

Preferably, the method comprises the step of performing an optimisation process for determination of a workpiece transport trajectory minimizing a total stress on the plurality of stations and the at least one transfer device. This optimisation is possible in addition to optimisation for throughput if there are still additional degrees of freedom. These additional degrees of freedom may be provided by employing servo presses or transfer devices with additional axes and/or by introducing additional or higher order segments to the parameterization of the workpiece and/or servo press trajectory.

The optimisation process may include a numerical optimisation of the remaining parameters in order to reach the minimum or maximum of a cost or utility function, respectively.

Other advantageous embodiments and combinations of features come out from the detailed description below and the totality of the claims.

BRIEF DESCRIPTION OF THE DRAWINGS

The drawings used to explain the embodiments show.

FIG. 18 a sample segment definition;

FIG. 19 the "Limits & Interference" form;

In the figures, the same components are given the same reference symbols.

Preferred Embodiments

The following symbols and abbreviations are used in this document:

| Fig. | Designates drawings | Figure |
|---|---|---|
| Tab. | Designates tables | Table |
| TCP | Tool Center Point | The Center of the Crossbar |
| TG | ToolGroup | The recipe (all properties) to produce a certain part |
| MotionSpec | Motion Specification | The motion properties for one transfer (roboBeam/roboFeeder) |
| MotionTemplate | Motion Template | The base of a transfer motion |
| UL | Unloading | The unloading section of the motion |
| LO | Loading | The loading section of the motion |
| UL-IN | Unloading Side, Move In | Section of motion: move into unloading position |
| UL-OUT | Unloading Side, Move Out | Section of motion: move out of unloading position |
| LO-IN | Loading Side, Move In | Section of motion: move into loading position |
| LO-OUT | Loading Side, Move Out | Section of motion: move out of loading position |

Figure 1:
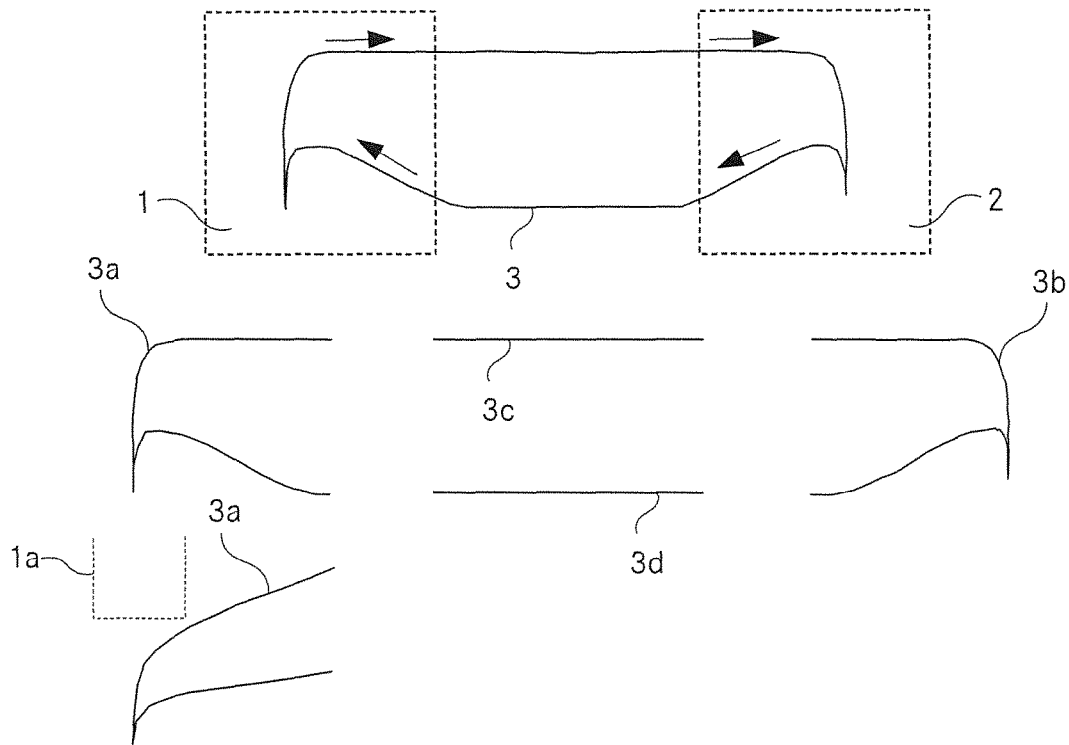
FIG. 1 a schematic representation of a workpiece transport path from a first press to a second press.

The FIG. 1 is a schematic representation of a workpiece transport path 3 from a first press 1 (left) to a second press 2 (right): A workpiece is unloaded from the first press 1, transported by the transport device to the second press 2 and loaded to the second press 2. The path 3 may be partitioned into an unloading section 3a, a loading section 3b and two intermediate sections 3c, 3d connecting the two sections mentioned before, as shown in the reference system of the lower (stationary) die. At the bottom of FIG. 1 the unloading section 3a is shown in the reference system of the upper (moved) die 1a of the first press 1. This is a reference system that is suitable for studying potential conflicts of the workpiece with the moved die.

Figure 2:
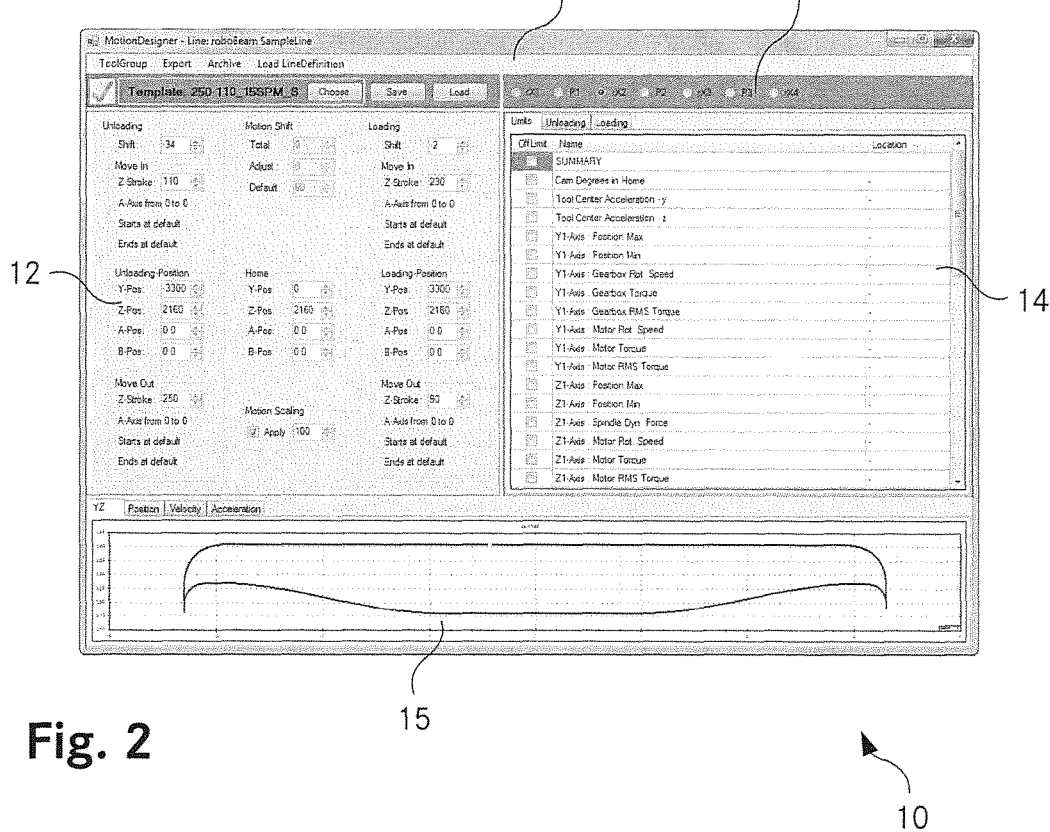
FIG. 2 the general setup of a graphical user interface of a software for running an inventive method.

The FIG. 2 represents the general setup of a graphical user interface 10 of a software for running an inventive method. The screen is partitioned into a menu bar 11, a "MotionSpec" form 12, an item selector 13, a "Limits & Interference" form 14 as well as a section 15 for displaying charts, such as charts showing the position of certain device and/or geometric axes in angle coordinates. The layout of the forms as shown in FIG. 2 is unchangeable. The content of the forms is changed depending on the ToolGroup and the item that is selected, see below.

The menu bar allows for accessing two functions, namely "ToolGroup" and "Export". The "Export" function allows for exporting numerical data of motion or interference curves to files.

Figure 3:
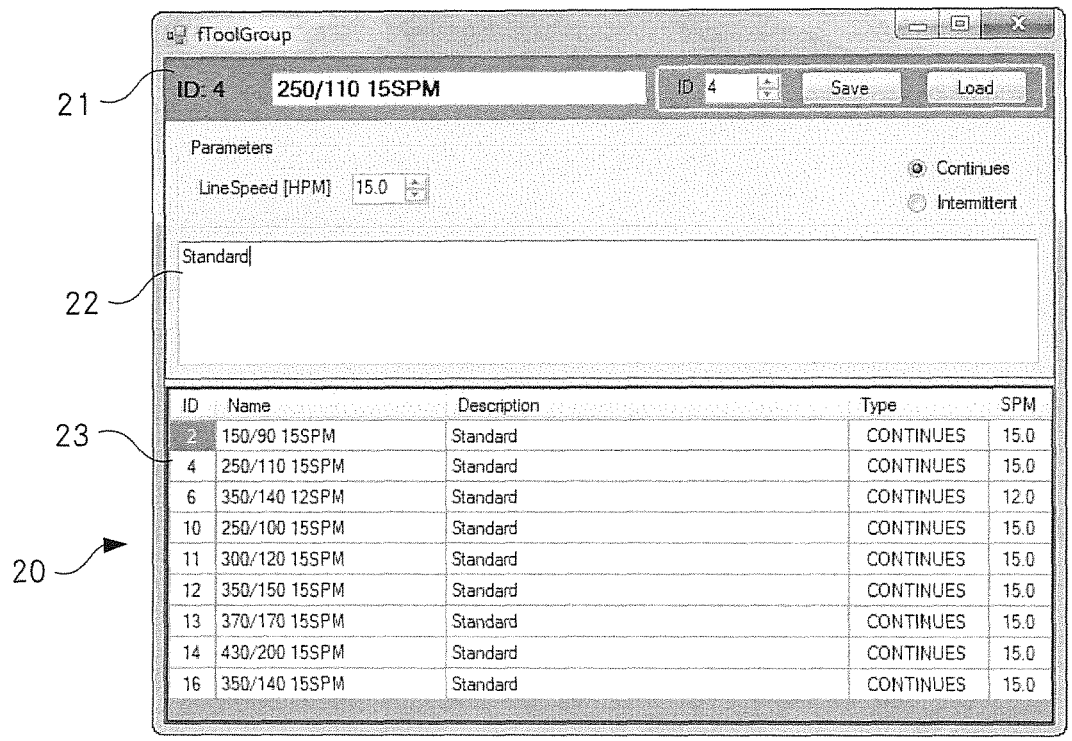
FIG. 3 the "ToolGroup" window of the graphical user interface.

Using the ToolGroup form, ToolGroups may be loaded, modified, created or saved. The corresponding form opens in a separate window after clicking the ToolGroup item in the menu bar. The FIG. 3 shows the "ToolGroup" window 20.

The ToolGroup definitions are stored in respective folders, whereas ToolGroups may be exported to the press line controller by copying the respective folders to the corresponding place of the controller's file system.

The ToolGroup defines the motion properties of the press line. The following quantities are defined:

name
description
ID
type (continuous/intermittent)
line speed (parts per minute)

The topmost field 21 of the ToolGroup window shows to the left ID and name of the actual ToolGroup. The right area allows saving and loading a TG. The middle field 22 below the topmost field 21 shows the properties of the actually loaded TG as listed above. The lower portion 23 of the form displays a list of available ToolGroups. TG may be loaded by double-clicking a TG in the list or pressing the Load button.

The interface allows for the following actions:
view and modify ToolGroup properties;
load a ToolGroup, this includes loading the Motion Specification (MotionSpec) to all feeder items;
save a ToolGroup to an existing ID (save changes) or to a new ID (create new TG)

The item selector shown in FIG. 2 includes a number of radio buttons that represent the items which are available in the line. As soon as an item is selected, the forms for MotionSpec, Limits and Charts will show the actual state of the selected item. Thereafter, the parameters and properties related to the corresponding item will be ready to be checked or modified.

Depending on customer or application requirements, the workpiece transport trajectories can be influenced on three different levels:
first (highest) level: 25 parameters (MotionSpec);
second level: 25+30=55 parameters (MotionSpec+TemplateGeneration);
third (lowest) level: 10*5*4=200 Parameter (SegmentDefinition, Full Access).

Figure 5:
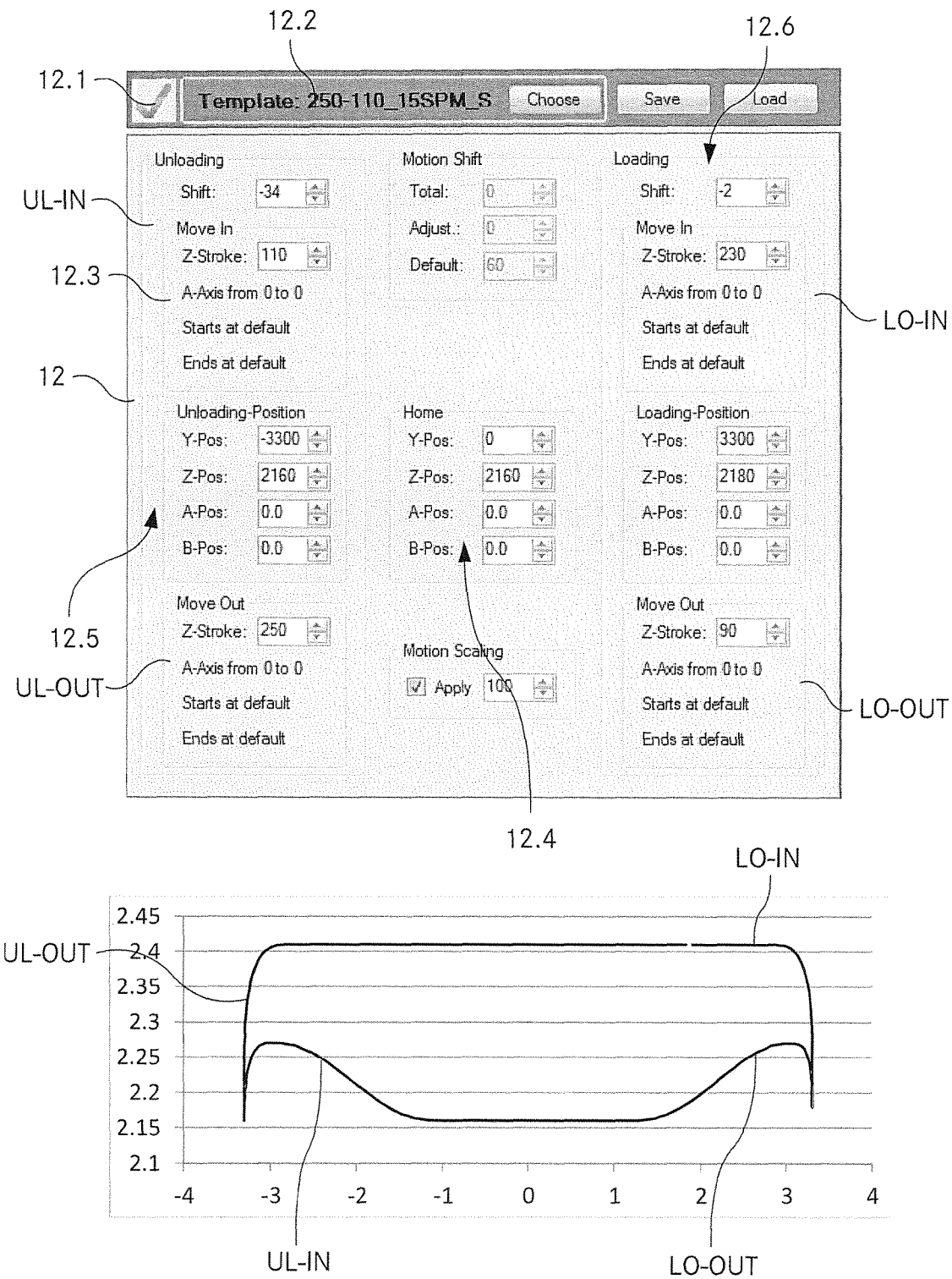
FIG. 5 the "MotionSpec" region of the graphical user interface.

The MotionSpec form 12 of FIG. 2 is shown in more detail in FIG. 5. The MotionSpec defines the basic parameters of the motion. These parameters include:
Positions for Unloading (UL) (3), Home (1) and Loading (LO) (6);
Z-Strokes within the 4 sections (UL-IN 2, UL-OUT 4, LO-IN 5, LO-OUT 7);
A-Axis Definition (value and timing for start and end of the motion within the 4 sections);
Shifts: Delay to portions of the motion (UL, LO) or the total motion (Motion Shift);
Template: the choice for the basis of the motion.

The top-left area 12.1 shows whether the motion is valid or not. The state represents the summary of the limits, as described in more detail below.

The middle section 12.2 shows the name of the template which is actually applied. By pressing the Choose-button a new template can be assigned to the MotionSpec.

Figure 4:
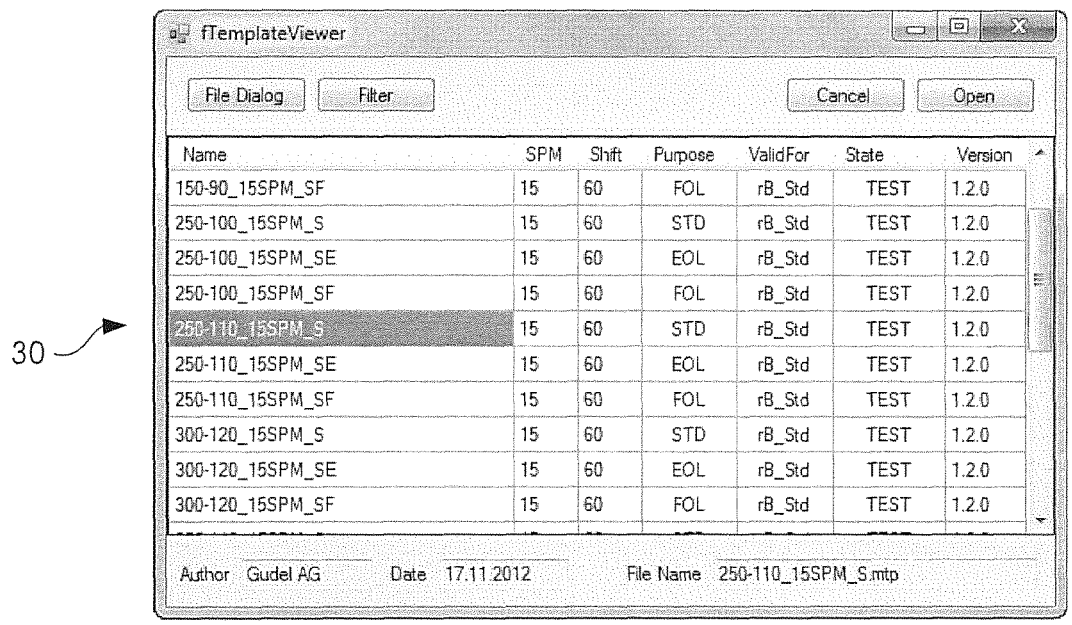
FIG. 4 the dialog for choosing a new template.

The form which opens, i. e. the TemplateViewer window 30 is shown in FIG. 4. It lists a number of available templates with their main characteristics. The template can be applied by double-clicking the template in the list or selecting the template and pressing the Open button.

The main area 12.3 of the MotionSpec form is partitioned into a number of sections. They apply to the different sections of the motion.

First of all, for the three positions Home (12.4), Unloading (12.5) and Loading (12.6) the TCP-coordinates are defined, by indicating the corresponding positions of the axes Y, Z, A and B (if applicable).

Figure 6:
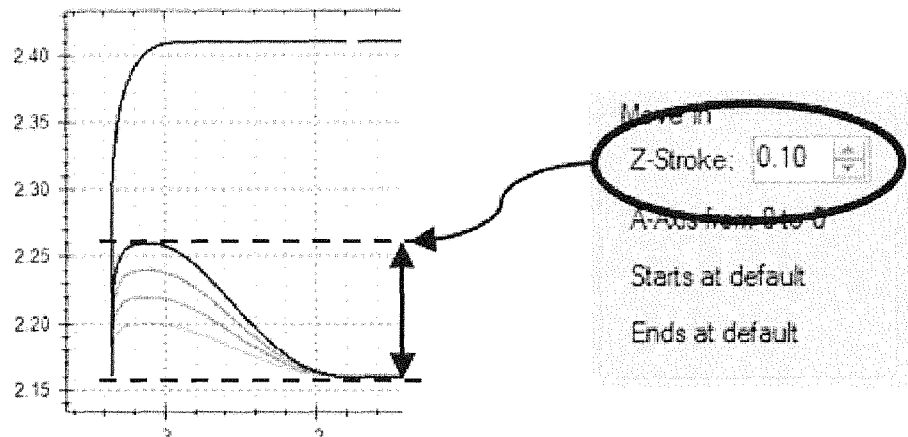
FIG. 6 the effect of adjusting vertical lift.

Furthermore, for each of the four sections, UL-IN, UL-OUT, LO-IN and LO-OUT the following properties are defined:

Stroke: The Z-Stroke defines the amount of vertical lift that is performed in the respective section. FIG. 6 shows an example for the move-in section of the unloading side (UL-IN).

Figure 7:
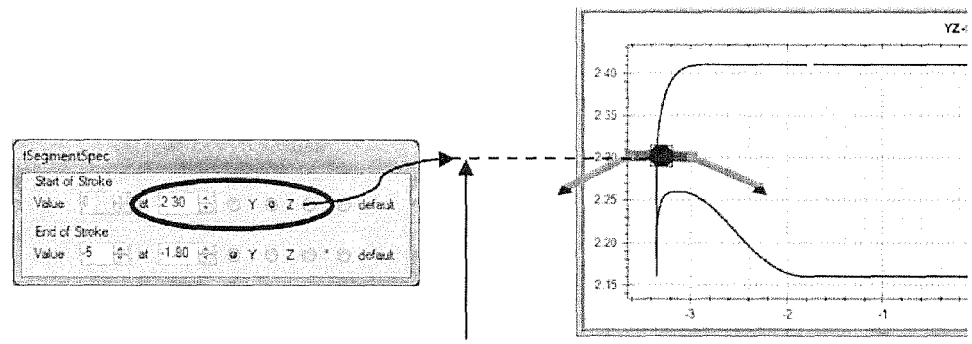
FIGS. 7, 8 the form to adjust the movement of the swivel axis and the effect of sample adjustments.
Figure 8:
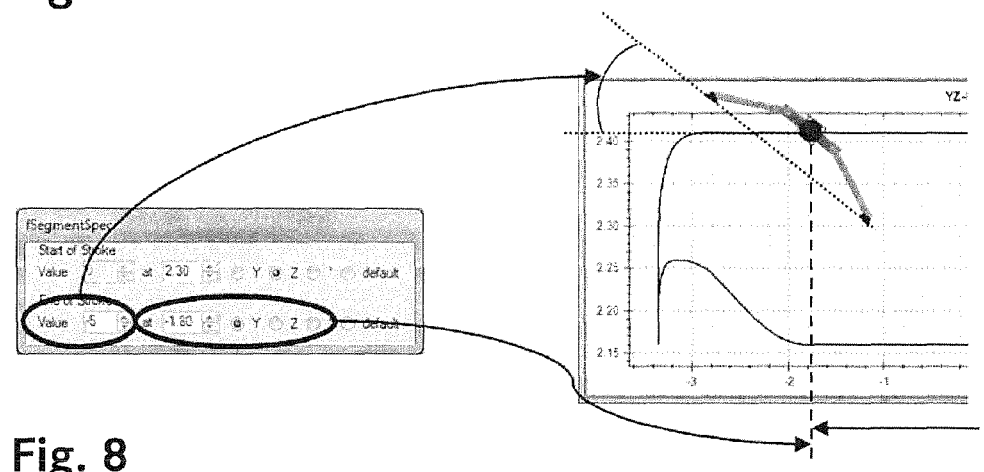

Amount of tilt and exact timing of the tilting motion in the A axis: For the timing definition, the point in time for start and end of motion needs to be set. The definition can be set by reference to a TPC-position (Y or Z) or by degrees of the cam angle. The form to edit the A-Axis definition appears as soon as the area of the section is clicked. It is shown in FIGS. 7 and 8. The illustrated sample shows the details of an A axis definition at UL-OUT. According to FIG. 7, the tilting motion is started as soon as Z=2.3 m is reached.

Figure 9:
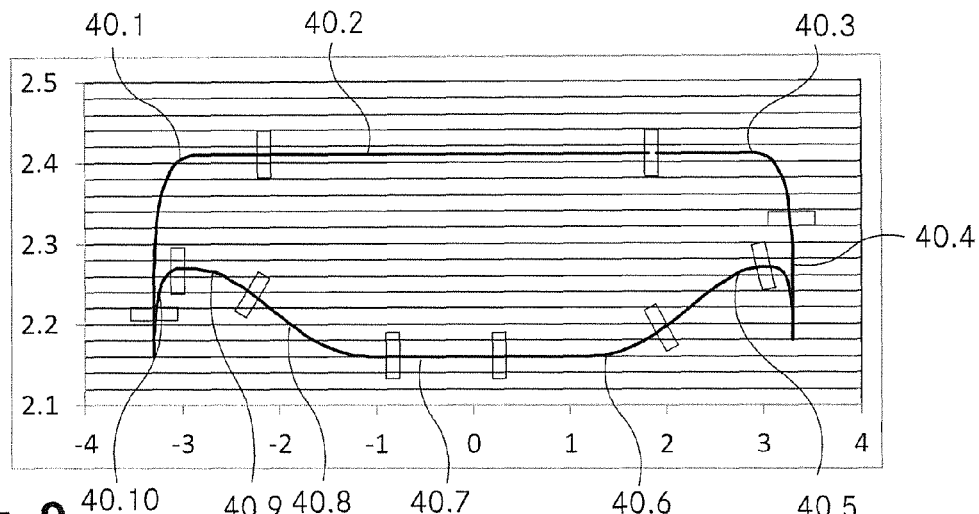
FIG. 9 the composition of the workpiece path, indicating the segments of the A-axis.

According to FIG. 8, the tilting motion is ended as soon as Y=−1.8 m is reached. In the shown sample (UL-OUT), the tilting angle can only be defined within the end definition. The tilting angle for the start of the motion is already defined by the A-Axis definition of the unloading position. The total A-Axis motion consists of 10 segments 40.1 . . . 40.10 as shown in FIG. 9.

Figure 10:
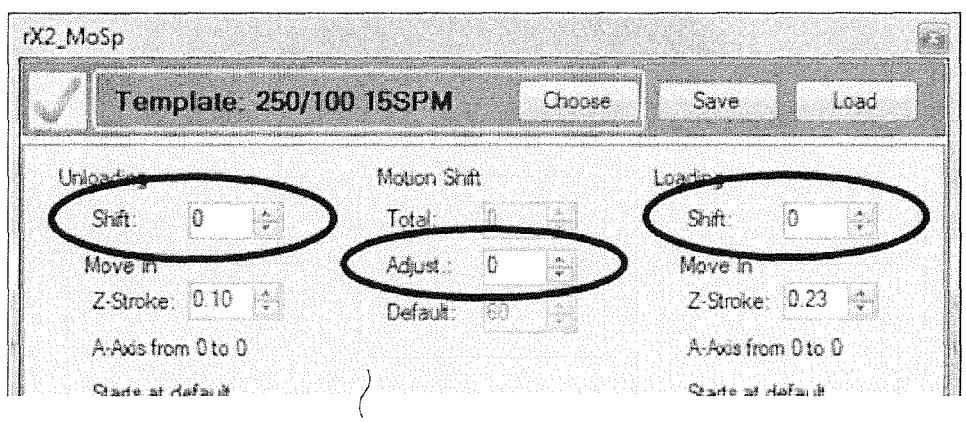
FIG. 10 the portion of the "MotionSpec" form relating to shifts.
Figure 11:
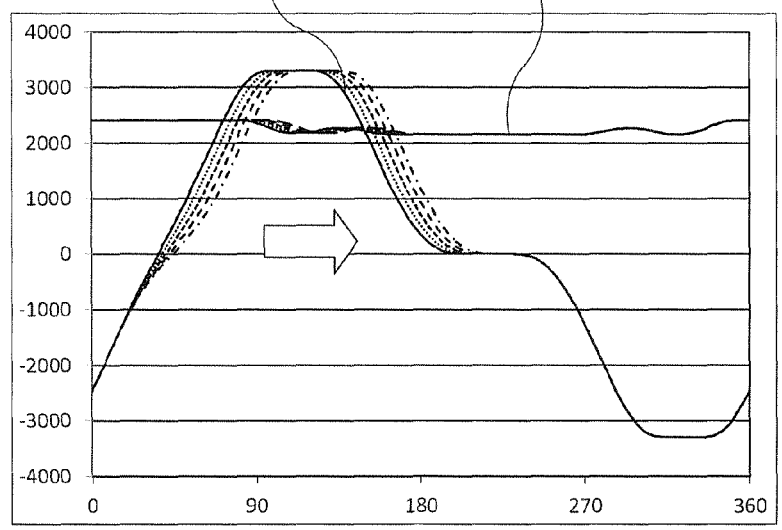
FIG. 11 the effects of applying a positive shift to the loading portion.

Shifts: The portion of the MotionSpec form 12 relating to shifts is shown in FIG. 10. Shifts allow to adjust the timing of the motion. Shifts at unloading and loading apply to the respective portion of the motion only. Motion Shift applies to the whole motion, i. e. the timing of all sections is changed synchronously. By applying a positive value, the respective portion is delayed by the specified amount of cam degrees. If a negative value is applied, the motion is shifted ahead of time. The FIG. 11 shows an example where a positive shift is applied to the loading portion. It can be seen that the motion 51 of the y axis and the motion 52 of the z axis are delayed in terms of cam degree. A similar shift will also be applied to further axes such as the swivel axis.

Shifting is used to adjust the distance in between two neighboring transfers and to optimize the interference with the press. Shifting allows to change the timing (forward/delay) of a section (unloading/loading) of the motion. Shifting is performed without any change in the path with respect to the lower die. Shifting may involve a single or a group of segments. A smooth transition from the shifted section to a non-shifted section is accomplished with special segments (velocity-to-velocity).

Figure 12:
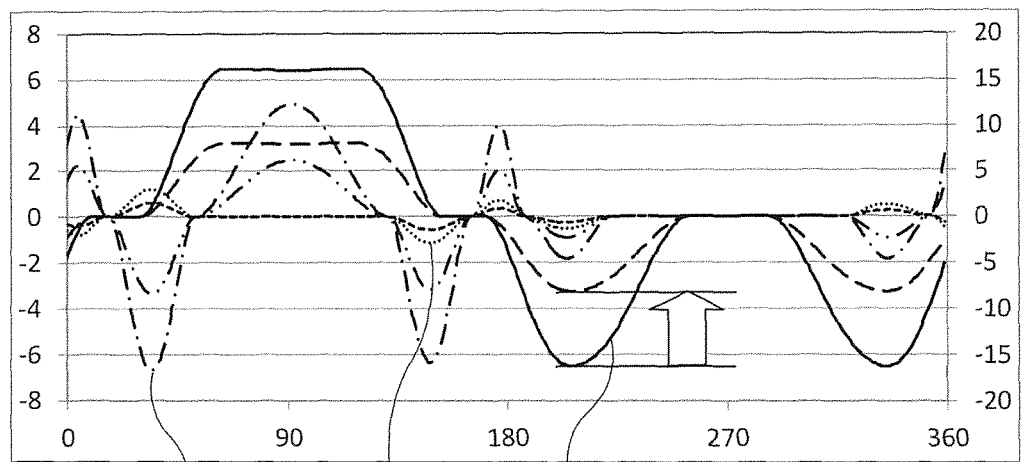
FIG. 12 the effect of running a template at half speed in velocity of the axes.
Figure 13:
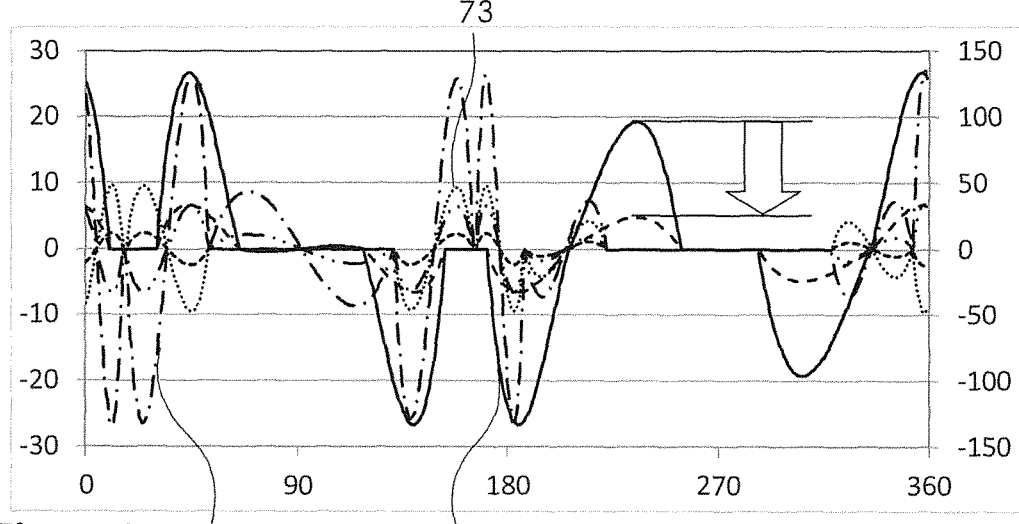
FIG. 13 the effect of running a template at half speed in acceleration of the axes.

Motion Scaling: MotionTemplates are designed for a predefined target line speed. They can be used at this speed, or any speed lower than the target line speed. If MotionTemplates are used at a speed lower than the target line speed, the same motion is performed in greater time. Therefore the dynamics of the motion is reduced. The FIG. 12 shows a velocity plot of an example where a 15 SPM template is run at a line speed of 7.5 SPM (the cycle time is 8 s). As can be seen, the speed of each axis (the velocity 61 of the swivel axis, the velocity 62 of the y axis and the velocity 63 of the z axis) is ½ of the original speed. As can be seen from the acceleration plot in FIG. 13, the acceleration is ¼ of the original acceleration (acceleration 71 of the swivel axis, acceleration 72 of the y axis and acceleration 73 of the z axis). MotionScaling allows separation of Feeder-Speed from Line-Speed. The amount of cam degrees used for motion is scaled according to a scaling factor. The start and stop of segments within the 360° of the cam are proportionally scaled. Since all segments are scaled proportionally, there is no change in the path with respect to the lower die. In principle, no shift-adjustment is required. The sections of interference (unloading/loading) are maintained during scaling. In order to retain the interference of the transport device and the workpiece with the press and the interference of two neighboring transport devices (or the workpieces carried by them), a fixed point is defined at the unloading side. The fixed point corresponds to the point in time where the two neighboring transport devices (or the workpieces carried by them, respectively) come closest to each other. The fixed point is held fixed in time when motion scaling is applied. In the context of motion scaling, the shift on the loading side is automatically determined based on the motion scaling parameter, and the temporal offset on the loading side is correspondingly adjusted.

Figure 14:
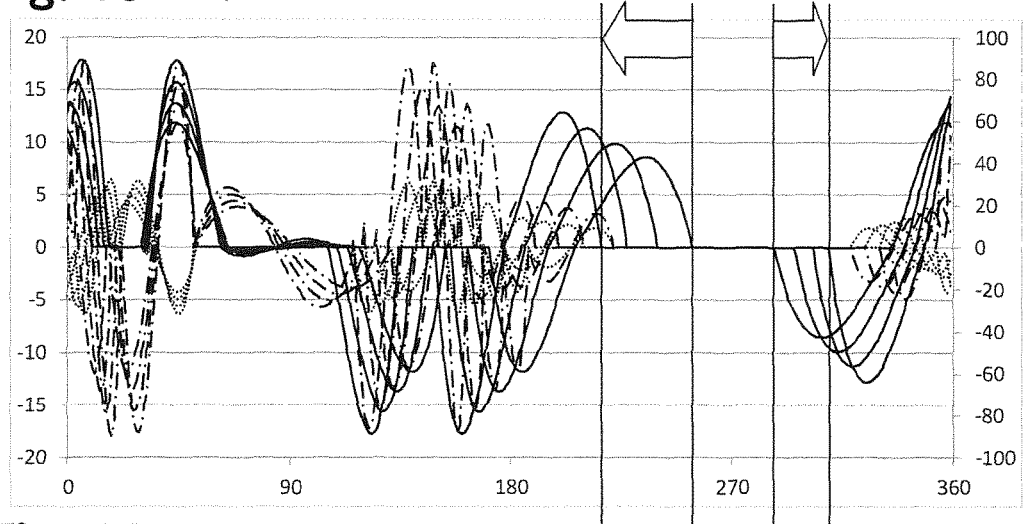
FIG. 14 the effect of applying a scaling factor.
Figure 15:
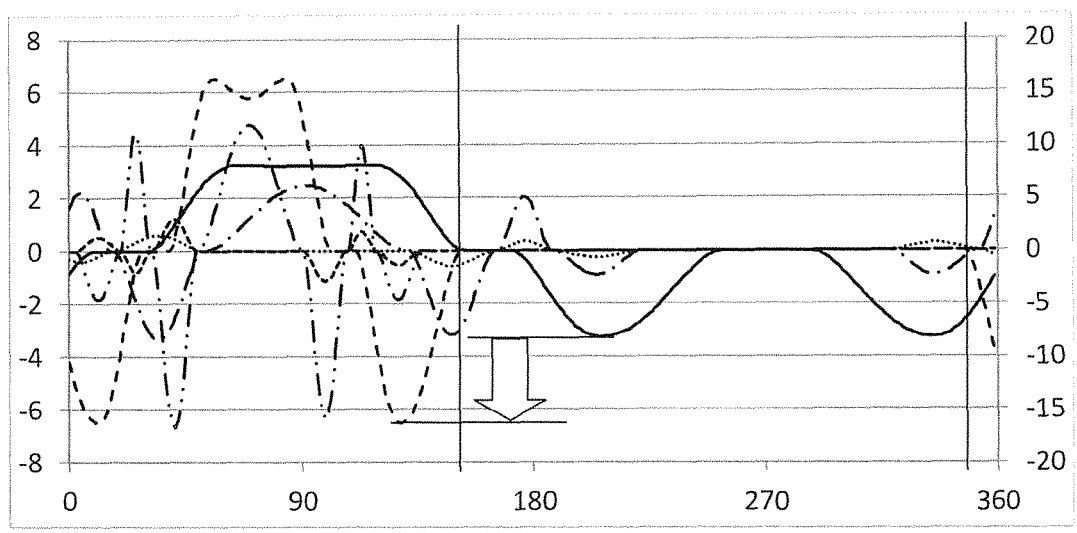
FIG. 15 the effect of applying a scaling factor on velocity of the axes.

MotionScaling allows making use of enhanced dynamics when running at a line speed lower than the target line speed. By default, the motion is covering almost the full 360° of the cam and only little time is spend in home. By applying a scaling factor, the amount of cam degrees which is spent for motion can be decreased, see the acceleration plot of FIG. 14. The remaining cam degrees are spent at home in standstill. Due to the fact, that with an increased ScalingFactor the motion is performed in short time, the dynamics of each axis is increased. A scaling factor of 1.0 corresponds to the original timing. A scaling factor of 2.0 results in a motion which is performed in half of the time compared to the original motion. (the other half is spent in the home position). Any ScalingFactor above 1.0, e. g. between 1.0 and 3.0, can be applied, where the maximum is typically limited to TargetSpeed divided by LineSpeed due to the dynamical limits of the system. The velocity plot of FIG. 15 shows the result of running the 15 SPM template at 7.5 SPM when a ScalingFactor of 2.0 is applied. The dynamics is back at its original level.

The motivation to apply MotionScaling is possible interference with the upper die. By reducing the amount of cam degrees which is spent in motion, the time of press interference (unloading and loading) is shortened with respect to the press motion. Therefore, the distance to the upper die is enhanced. As an example: A motion at 15 SPM shows problems with interference to the upper die. By reducing the LineSpeed to 12 SPM, a ScalingFactor of 1.25 can be applied. This will shorten the time required for unloading/loading by 25% and hopefully solves the interference problem.

Within the MotionSpec form the following actions are available:

view and modify the MotionSpec Properties;

choose a MotionTemplate;

load and save a MotionSpec.

Figure 16:
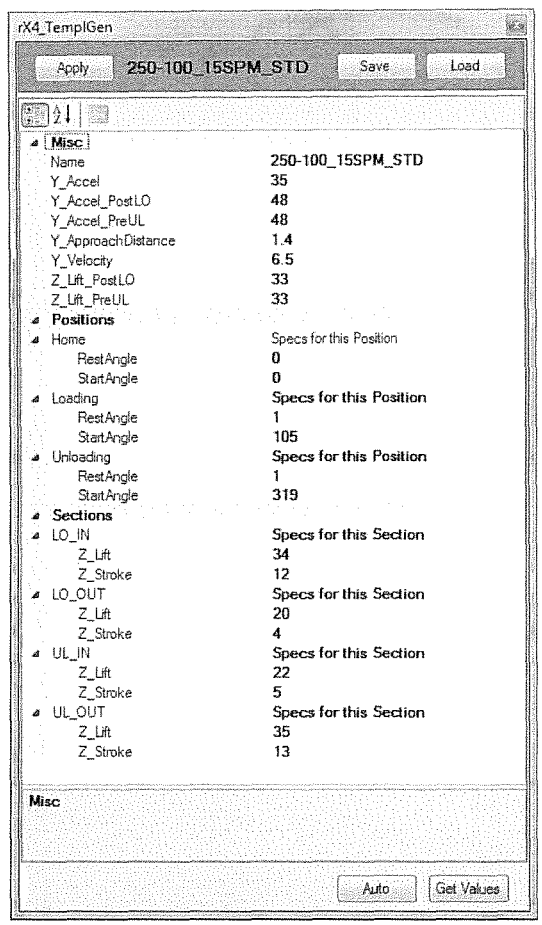
FIG. 16 the template generation dialog.

The described system provides the user with further means to adapt the workpiece transport trajectory. Namely, specific transitions between different segments of the trajectory may be adjusted. The FIG. 16 shows the corresponding template generation dialog. For each Position (Home, UL, LO) the following parameters are defined:

StartAngle: the cam angle when the position is reached;

RestAngle: the amount of cam degrees to remain in the position

For each of the 4 sections (UL_IN, UL_OUT, LO_IN, LO_OUT) the following parameters are defined:

Z_Lift: the cam angles spent for the total vertical movement;

Z_Stroke: the cam angles spent for the vertical (straight) portion of the motion.

Figure 17:
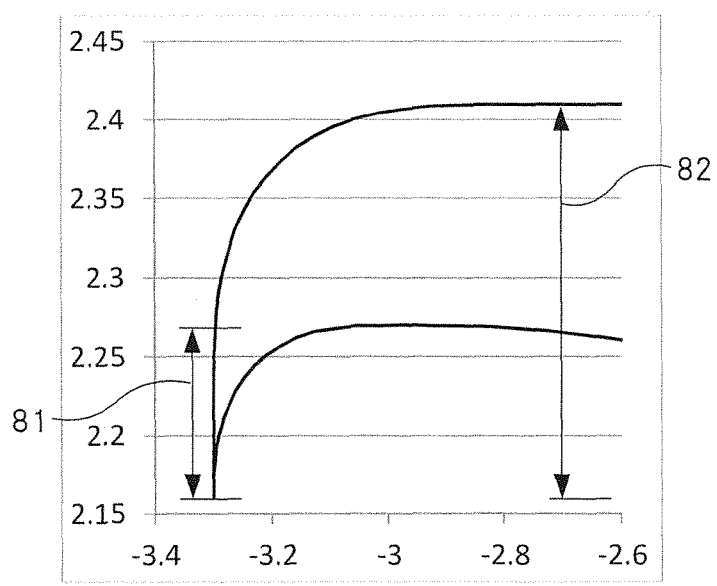
FIG. 17 the effects of adjusting the vertical stroke.

The Z-Stroke 81 defines the delay of the start of the Y-Motion with respect to the start of the Z-Motion, whereas the Z-Lift 82 defines the total vertical movement. This is shown in FIG. 17.

The motion within the press is dynamically optimized and maintained at all times. In each of the 4 sections (UL_IN, UL_OUT, LO_IN, LO_OUT) the condition of the Y-Axis when entering/leaving the press is defined:

Y_TargetVelocity: velocity of Y-Axis when entering/leaving the press;

Y_ApproachDistance; distance from unloading or loading position to reach target speed;

Y_Accel: cam angles from unloading- or loading position to reach target speed.

The motion of an axis is composed from a number of segments, the properties of which are adjusted by adjusting the parameters in the template generation dialog. All segments have a definition for their start and end angle on the 360° of the cam. Two neighboring segments have to maintain the same conditions (cam-angle, position, velocity, acceleration) at the point of contact. Several types of segments are foreseen in the described system, among these:

| StS Standstill to Standstill # parameters 2 | | | | | | |
|---|---|---|---|---|---|---|
| start conditions | | | end conditions | | | |
| position | velocity | acceleration | position | velocity | acceleration | further conditions |
| StartPos | 0 | 0 | EndPos | 0 | 0 | — |

| StV Standstill to Velocity # parameters 3 | | | | | | |
|---|---|---|---|---|---|---|
| start conditions | | | end conditions | | | |
| position | velocity | acceleration | position | velocity | acceleration | further conditions |
| StartPos | 0 | 0 | EndPos | endVelocity | 0 | — |

| VtV Velocity to Velocity # parameters 4 | | | | | | |
|---|---|---|---|---|---|---|
| start conditions | | | end conditions | | | further |
| position | velocity | acceleration | position | velocity | acceleration | conditions |
| StartPos | StartVelocity | 0 | EndPos | endVelocity | 0 | — |

| StSV Standstill to Standstill, limited velocity # parameters 3 | | | | | | |
|---|---|---|---|---|---|---|
| start conditions | | | end conditions | | | |
| position | velocity | acceleration | position | velocity | acceleration | further conditions |
| StartPos | 0 | 0 | EndPos | 0 | 0 | MaxVelo |

Figure 18:
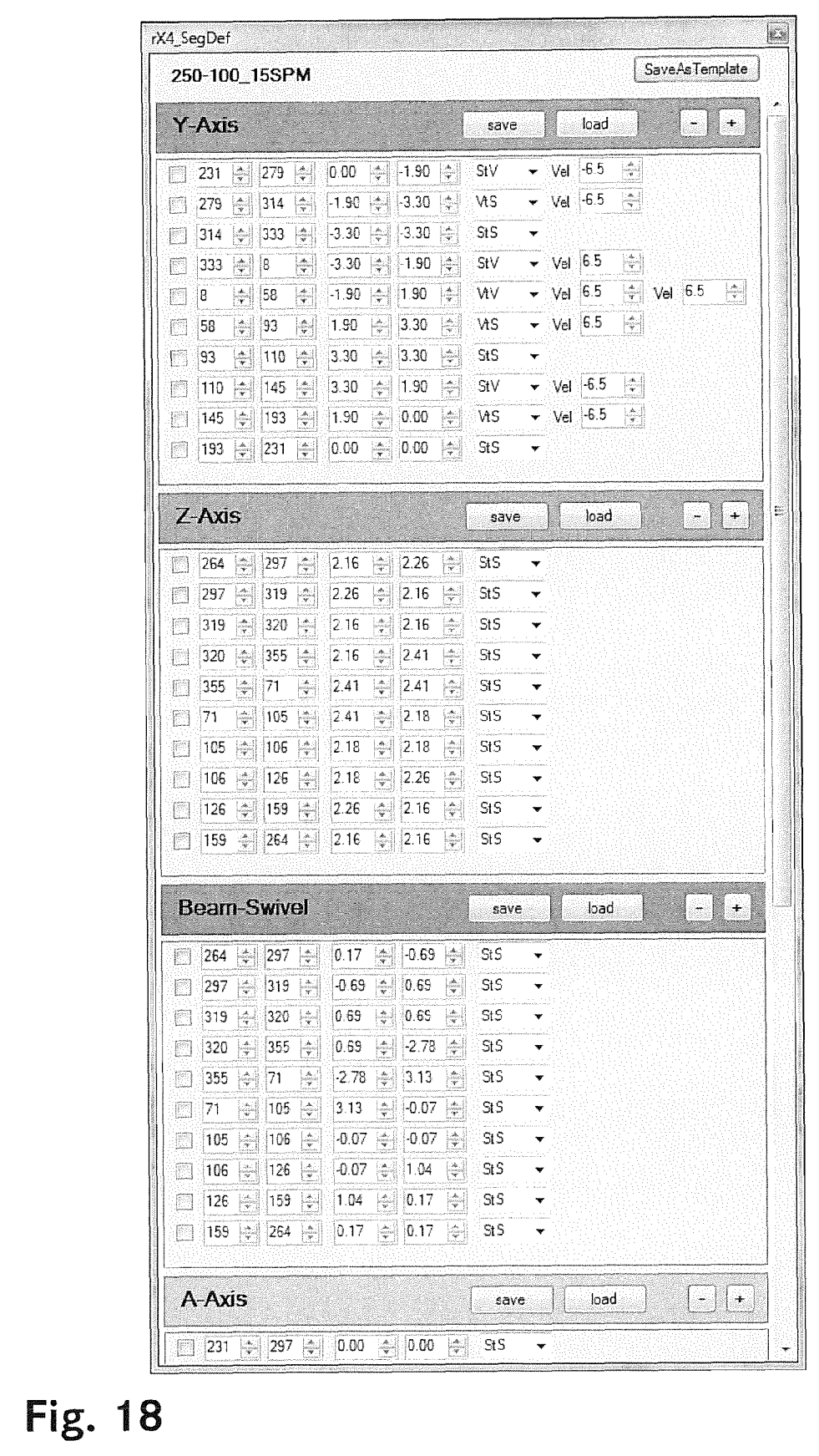

A sample segment definition is shown in FIG. 18. For each axis, the 360° operation cycle is described by a number of segments. Every segment is defined by the start and end angle and the corresponding position in axis coordinates (StartPos, EndPos). Depending on the segment type, further information such as StartVelocity and/or EndVelocity is provided. In addition to the two layers described before, the user has the possibility of changing the individual segment definitions and even to generate further segments for all axes. By doing so, the user has essentially full control over the definition of a candidate workpiece trajectory.

As mentioned above, the top-left area of the MotionSpec form shows whether the motion is valid or not. The state represents the summary of the limits, as described in the following. The motion is checked respecting a set of limits. Only if all limits are within range, a motion is valid to be loaded to the machine. The "Limits & Interference" form shown in FIG. 19 displays the full list of limits that are checked. Limits that are hit are marked "OffLimit" (i. e. shaded) and the location of exceedance is specified.

Figure 20:
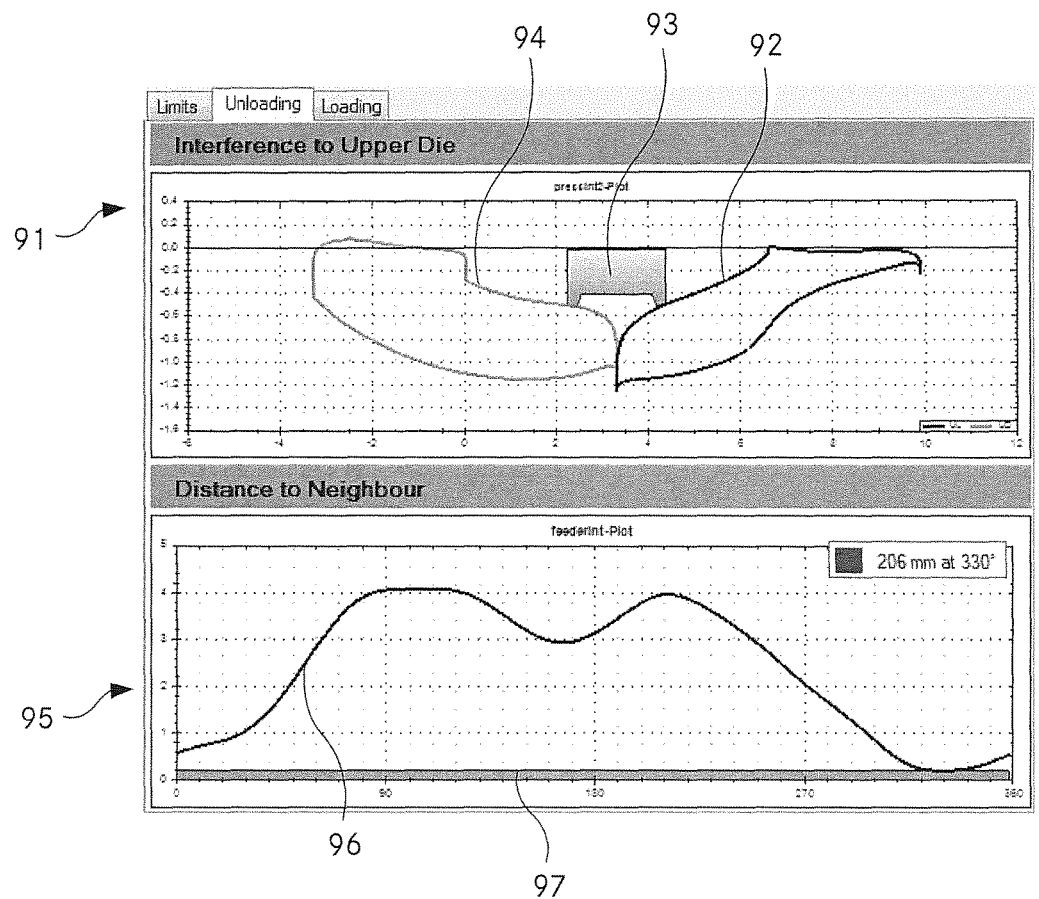
FIG. 20 the graphs displaying the interference with the upper die and the distance to the neighboring transfer device.

To run a part in production, it has to be verified that there is enough clearance to the upper dies as well as to the neighboring items. The interference charts allow checking the clearance on the unloading as well as on the loading side. The upper portion 91 of the form shown in FIG. 20 displays the interference to the upper die 93. The interference curve 92 of the selected item is shown in black color. The curve 94 for the neighboring item appears in grey color. Both curves 91, 92 are shown in the reference system of the upper die. The lower portion 95 of the form displays the distance to the neighboring item over the full cycle of 360° (curve 96). The lower, shaded area 97 adjacent to the zero line, corresponds to the distance which should not be underrun.

In the "Charts" section various charts may be displayed. They help to graphically check details of the motion. Changes to properties in the MotionSpec are updated in the graphs in real-time. The user controls allow to zoom/unzoom, print or save images, export curve data and many other functions which are accessible with a right mouse click in the chart area.

Figure 21:
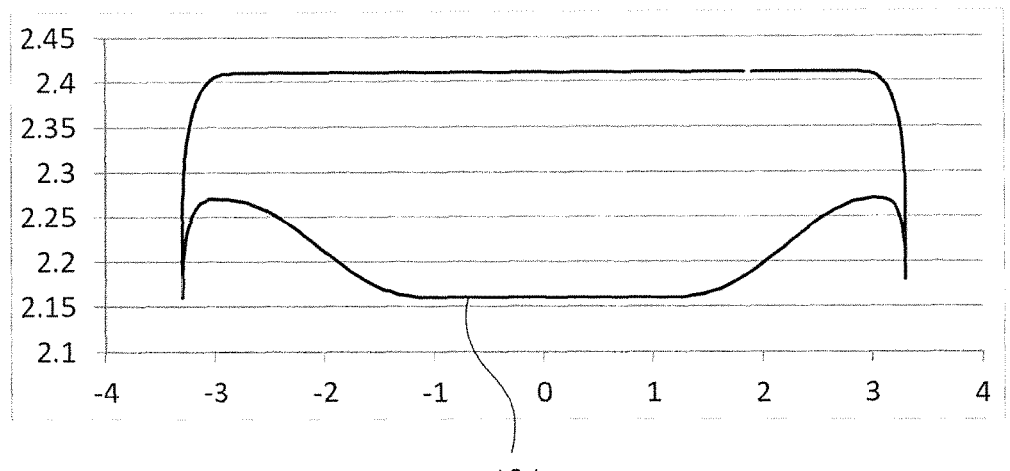
FIGS. 21-24 samples of available charts.
Figure 22:
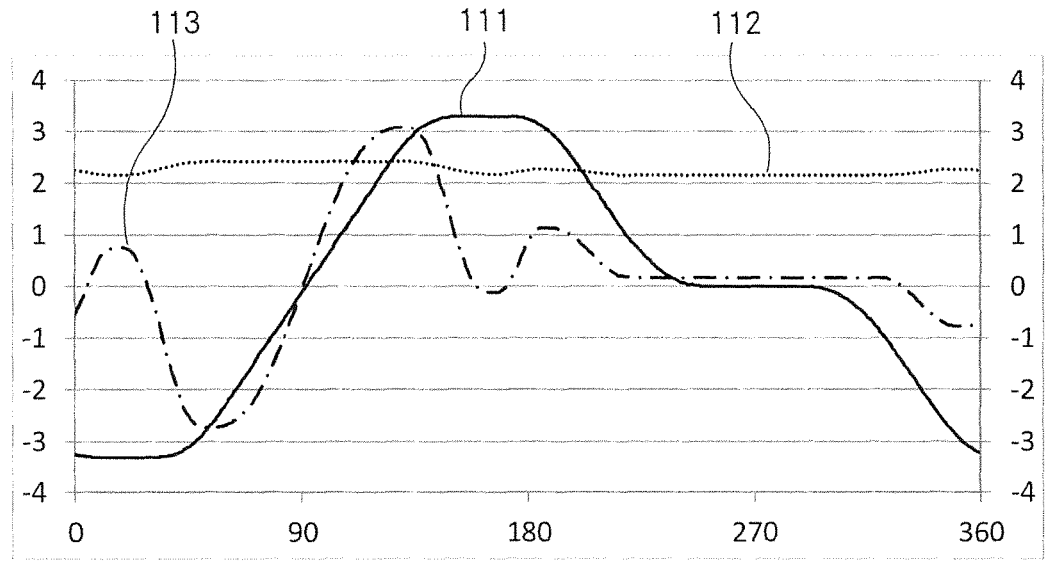
Figure 23:
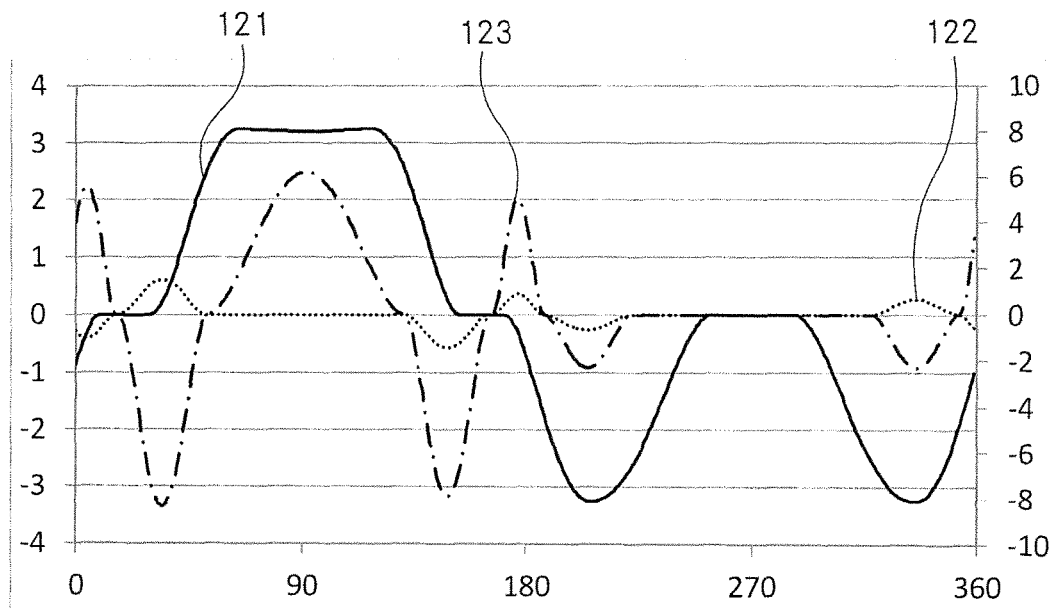
Figure 24:
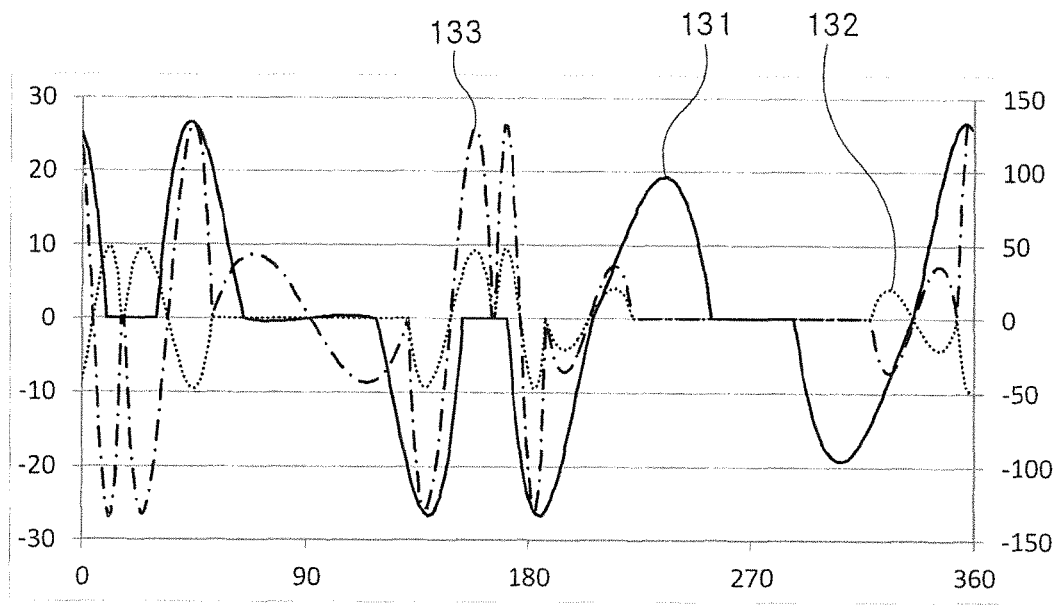

Samples of available charts are shown in FIGS. 21-24. The FIG. 21 shows a YZ chart displaying the path 101 of the TCP of the motion. The FIG. 22 shows a Position chart displaying the position of each axis over the full cycle of 360°, namely the position 111 of the Y axis, the position 112 of the Z axis, and the position 113 of the swivel axis. In the shown example, the further axes (A and B) are not used, i.
e. constantly at 0. The FIG. 23 shows a Velocity chart
displaying the velocity of each axis over the full cycle of
360°, namely the velocity 121 of the Y axis, the velocity 122
of the Z axis, and the velocity 123 of the swivel axis. The
FIG. 24 shows an Acceleration chart displaying the acceleration of each axis over the full cycle of 360°, namely the
acceleration 131 of the Y axis, the acceleration 132 of the Z
axis, and the acceleration 133 of the swivel axis.

Utilizing a servo press allows for variable stroke characteristics. Within the described system, the operation of the
servo press is defined by manually set and automatically
calculated parameters. These parameters include the following die-/part depending specifications:
deep draw height;
deep draw velocity profile;
deep draw energy profile.

A validation of the stroke performance takes into consideration mechanical and electrical models of the die, the press
and its drive drain.

The parameters for the dynamical model include:
moving mass/inertias;
maximum slide velocity;
friction.

The parameters for the electrical model of the motor and
drive include:
maximum motor velocity;
maximum torque, current and power;
electrical losses.

The planning process respects the deep draw velocity
profile as well as all the limits of the mechanical and
electrical system. It aims at an optimized press opening for
the automation by maximizing the slide velocity as long as
the workpiece is outside of the deep draw process. It further
provides quantification and visualization of safety margins
with respect to mechanical/electrical limits. The deep draw
velocity profile may be maintained independent from press
or line speed.

By generating a current profile as calculated from the
dynamic model and providing that profile to the line, position lag due to current adjustments may be minimized.

Figure 25:
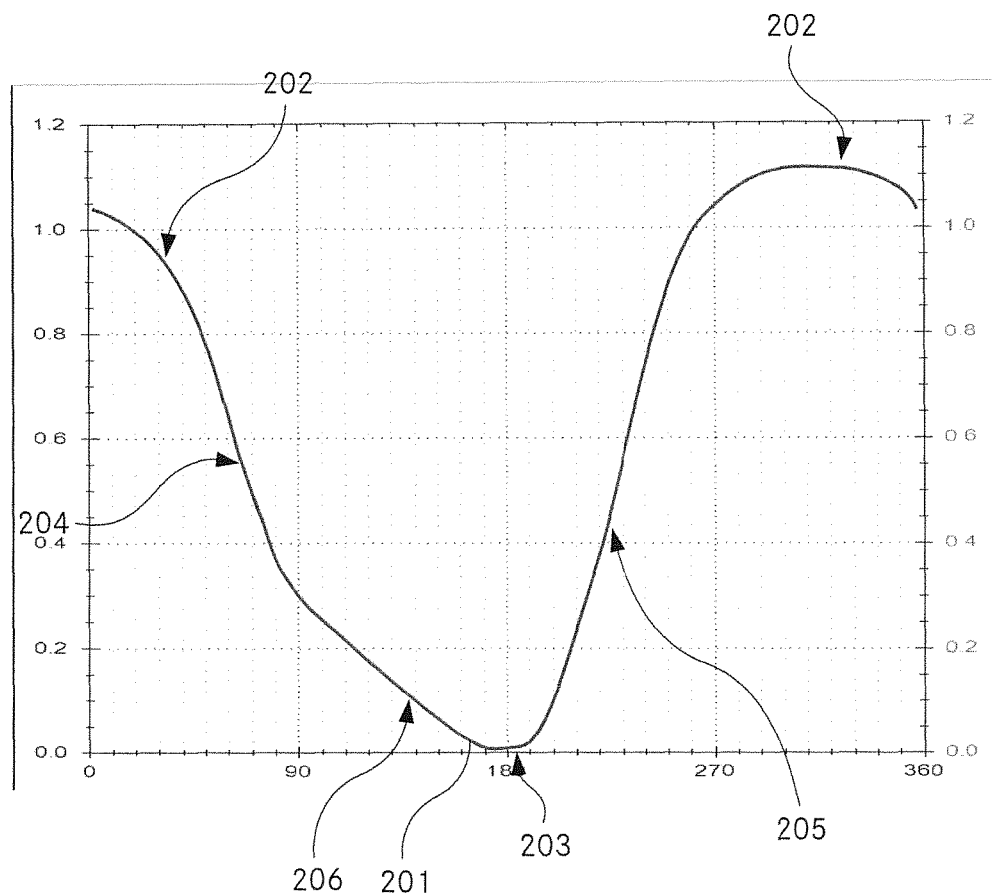
FIG. 25 a diagram depicting the press stroke of a servo press and the constraints imposed.

The FIG. 25 is a diagram depicting the press stroke 201
of a servo press and the constraints imposed. The Figure
displays the press angle parameter on the horizontal axis and
the actual position of the upper die on the vertical axis. As
can be seen from the diagram, the maximum velocity is
limited in the different phases of the operation cycle: In a
first region 202 (about 270° to 45°) the velocity is limited by
the maximum speed of the motor as this is the region where
the excentric bearing of the slide is near its upper dead point.
The same is true in the region 203 of the lower dead point
(i. e. around 180°). In the adjacent regions 204, 205 (about
45° to 90° and about 200° to 270°) the maximum velocity is
limited by the mechanical properties of the slide and the
guiding system of the slide. In the region 206 of the actual
working of the workpiece (deep drawing, about 90° to 180°)
the maximum velocity is given by the allowed deep drawing
velocity for a given workpiece, relating to the allowed forces
on the workpiece. Changes in velocity, especially the braking required before contacting the workpiece, are limited by
the motor torque.

Figure 26:
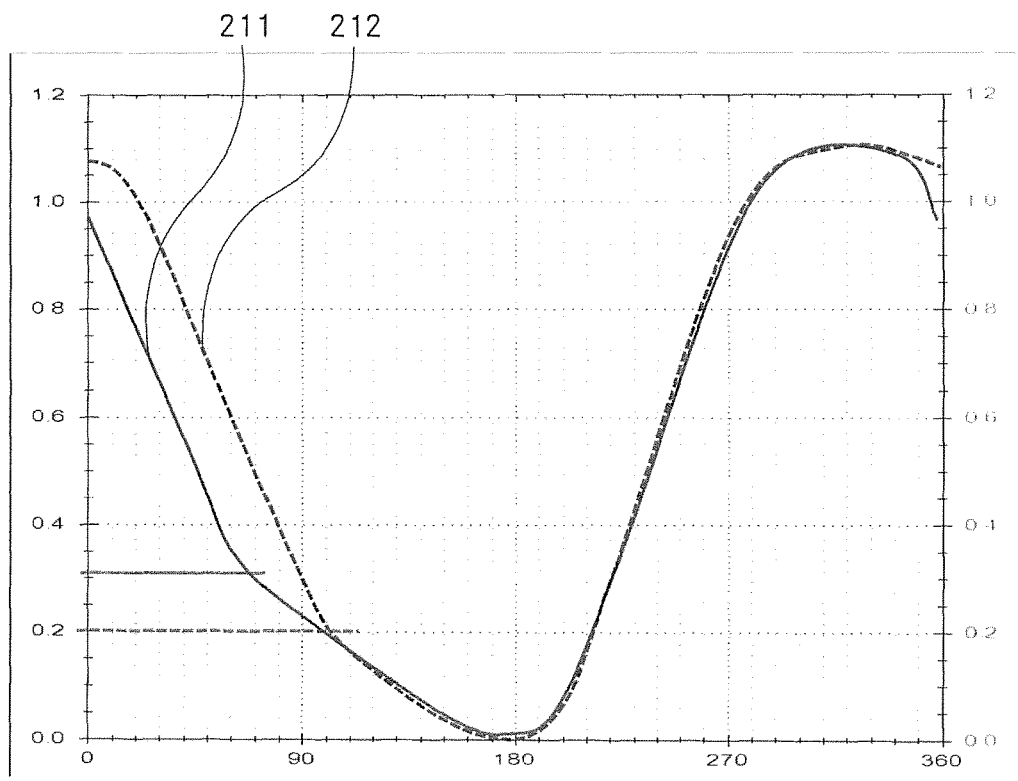
FIG. 26 two different press strokes relating to different deep drawing heights.

The FIG. 26 shows two different press strokes relating to
different deep drawing heights, namely the press stroke 211
for a deep drawing height of 300 mm and the press stroke
212 for a deep drawing height of 200 mm.

Figure 27:
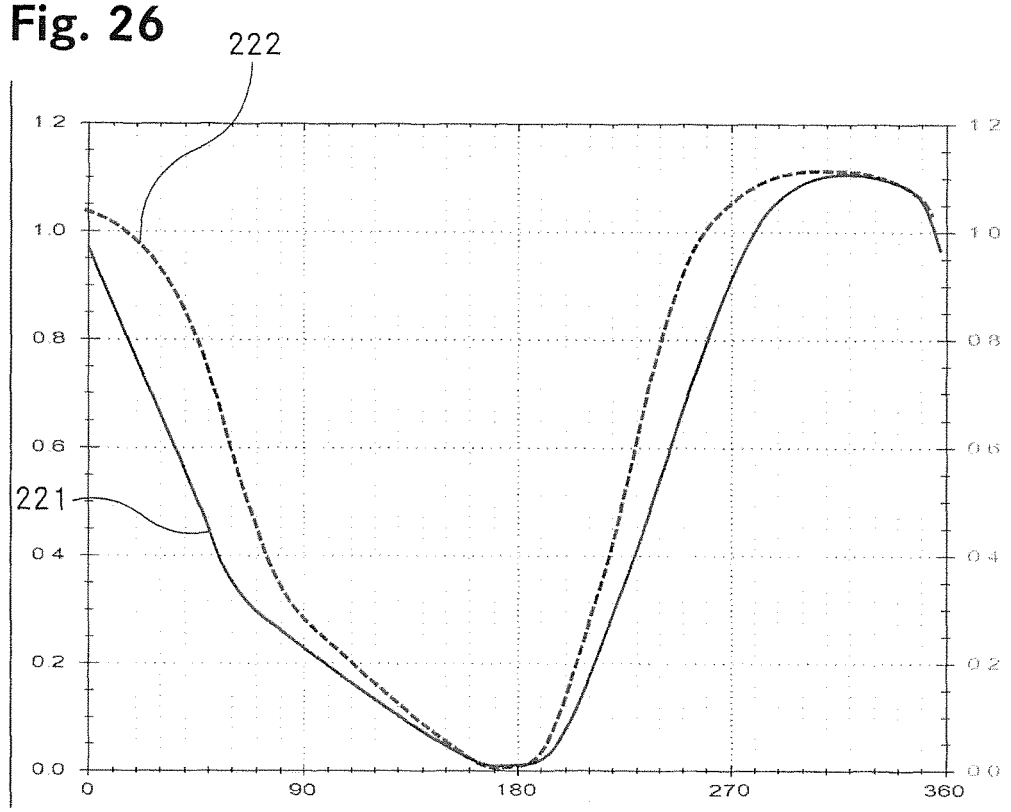
FIG. 27 two different press strokes relating to different operation speeds of the multiple station press.

The FIG. 27 shows two different press strokes relating to
different operation speeds of the multiple station press,
namely the press stroke 221 for an operating speed of 18
strokes per minute and the press stroke 222 for an operating
speed of 15 strokes per minute.

The limits on velocity imposed by the deep drawing
process, the slide motion and the motor are maintained over
a change in cycle time. Therefore, with a lower cycle time,
the stroke may be performed faster within the 360° of the
operation cycle of the press without exceeding the limits.
This is what is shown in FIG. 27.

The system includes the complete press-line (all presses
as well as all feeders). All elements have a common cycle
time, presses may be operated in continuous mode or
intermittently. The performance may be balanced over all
items, i. e. the stress on the components (and the available
safety margins) may be distributed in order to maximize the
lifetime of the system. At the same time, performance is
maximized over all components. Furthermore, energy management over the complete press line is possible.

Figure 28:
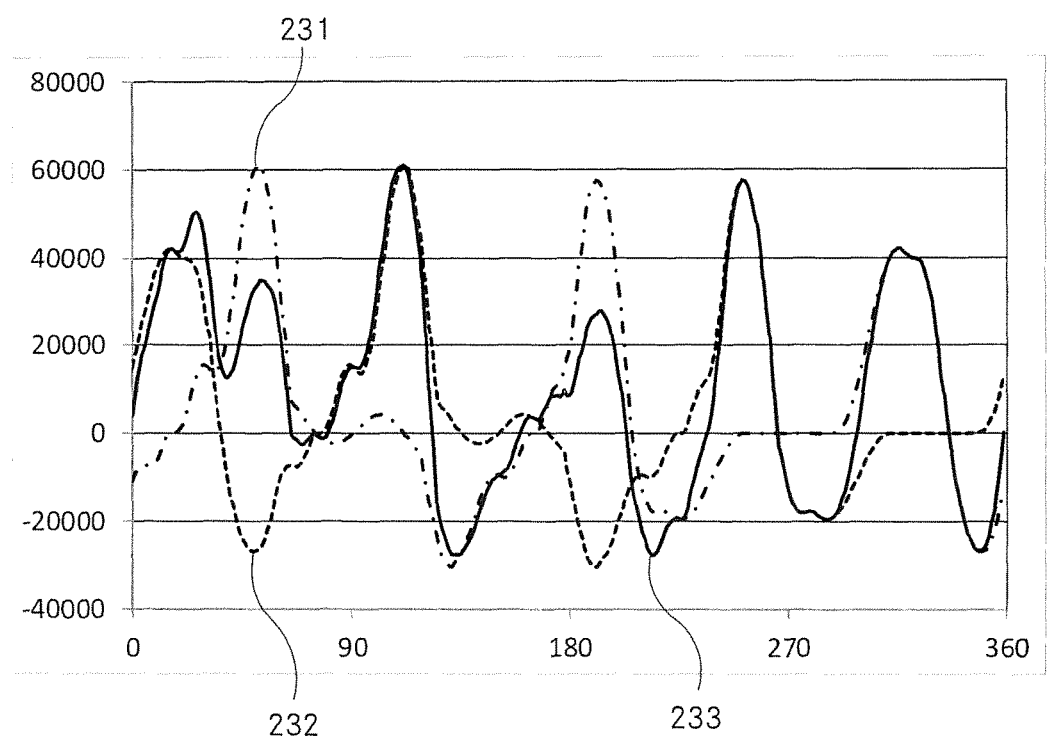
FIG. 28 the simulated power consumption of two transfer devices.

The FIG. 28 shows the simulated power consumption of
two transfer devices. The curves 231, 232 show the power
consumption of two transfer devices as a function of the
press angle. This includes the power needed for all the axes
of the respective transfer device. As can be seen from the
Figure, the maximum consumption of each of the devices is
slightly above 60 kW. In the given example, the devices are
controlled in such a way that the sum of the consumption of
both devices displayed by the curve 233 does not substantially exceed that maximum consumption, i. e. at the press
angle one of the devices has a maximum consumption the
consumption of the other device is close to a minimum
value. As can be seen further from the Figure, there are
sections in which the power consumption of a given device
is negative, i. e. energy may be temporarily stored or fed
back to the power supplying grid. Accordingly, by suitably
controlling the transfer devices and meeting the constraints
of the press transfer, the maximum consumption of a plurality of transfer devices may be even reduced compared to
that of a single device.

The invention is not restricted on the described embodiment. Numerous variations are possible, for example with
respect to the parameters for parameterizing the workpiece
or press tool trajectories or with respect to the properties of
the user interface.

In summary, it is to be noted that the invention provides
for a method for the determination of workpiece transport
trajectories in a multiple station press that facilitates the
determination of workpiece transport trajectories that allow
for high throughput.

The invention claimed is:
1. Method for the determination of workpiece transport
trajectories in a multiple station press, comprising the steps
of
  a) providing a set of constraints for the workpiece transport trajectories, the constraints comprising at least
     pickup and deposit positions for a workpiece in a
     plurality of stations of the multiple station press;
  b) providing machine properties of the plurality of stations and of at least one transfer device for transporting
     the workpiece from a first of the plurality of stations to
     a second of the plurality of stations;
  c) providing information on a candidate workpiece transport trajectory;
  d) simulating the plurality of stations and the at least one
     transfer device based on the provided information for
     determining whether the candidate workpiece transport
     trajectory conforms with the provided machine param- eters, such that it is physically possible to transport the workpiece along the trajectory;

e) displaying the result of the determination; wherein f) electing a workpiece transport trajectory from said determined results;

g) exporting said elected workpiece transport trajectory to a controller to control said multiple station press and one or more transfer devices that transport said workpiece between each station of said multiple station press;

h) the workpiece transport trajectories and the candidate workpiece transport trajectory are parameterized by a plurality of positions of a plurality of axes as a function of an angle parameter;

i) the workpiece transport trajectories and the candidate workpiece transport trajectory are partitioned into a plurality of segments, each of the segments including the axes positions for a continuous range of values of the angle parameter; and wherein j) the information on the candidate workpiece transport trajectory comprises a set of motional information and values of angle parameters relating to transitions between neighbouring segments of a set of segments of a trajectory template, the motional information at least comprising velocity information.

2. Method as recited in claim 1, further comprising the step of providing information on a press tool geometry of the plurality of stations and/or a workpiece geometry, wherein the simulation step includes a determination whether the candidate workpiece transport trajectory conforms with the provided press tool and/or workpiece geometry, such that it is physically possible to transport the workpiece along the trajectory.

3. Method as recited in claim 1, wherein a first of the segments relates to unloading a workpiece from a pickup position and wherein a second of the segments relates to loading a workpiece in a deposition position.

4. Method as recited in claim 3, wherein at least a third segment connects an end of the first segment to a start of the second segment and wherein at least a fourth segment connects an end of the second segment to a start of the first segment.

5. Method as recited in claim 1, wherein the information on the candidate workpiece transport trajectory comprises at least one shift parameter, wherein the shift parameter relates to a temporal offset of at least one segment of the candidate workpiece transport trajectory.

6. Method as recited in claim 5, wherein the at least one shift parameter comprises an unloading shift parameter and a loading shift parameter for delaying or forwarding a running through an unloading or a loading segment, respectively.

7. Method as recited in claim 5, wherein the at least one shift parameter comprises a general motion shift parameter for delaying or forwarding a running through a complete succession of segments constituting the candidate workpiece transport trajectory.

8. Method as recited in claim 1, wherein the plurality of segments comprise at least one velocity-to-velocity segment, the velocities at a beginning and at an end of the segment being predetermined and non-zero.

9. Method as recited in claim 1, wherein the information on the candidate workpiece transport trajectory comprises a motion scaling parameter, wherein the motion scaling parameter is a scaling factor for proportionally scaling a start and stop of segments in angle parameters.

10. Method as recited in claim 1, wherein the trajectory template comprises a plurality of segments chosen from the following types of segments:
a) standstill-to-standstill;
b) standstill-to-velocity;
c) velocity-to-standstill;
d) velocity-to-velocity;
e) standstill-to-standstill with limited velocity.

11. Method as recited in claim 1, wherein the trajectory template comprises a first segment type, the trajectory of which being parameterized by a polynomial of a first order, and a second segment type, the trajectory of which being parameterized by a polynomial of a second order, the first order being different from the second order.

12. Method as recited claim 1, wherein the information on the candidate workpiece transport trajectory comprises a move in and/or a move out stroke of an unloading and/or a loading path.

13. Method as recited in claim 1, wherein at least one of the plurality of stations is a servo press, wherein the machine properties of the plurality of stations comprise information on a maximum velocity, acceleration and/or maximum force allowed on the servo press.

14. Method as recited in claim 13, further comprising the step of providing information on a candidate servo press trajectory, wherein the simulation of the plurality of stations and the at least one transfer device includes a simulation of the servo press operated according to the provided candidate servo press trajectory.

15. Method as recited in claim 14, wherein the information on the candidate servo press trajectory comprises at least one of the following:
a) a deep draw height;
b) a deep draw velocity profile;
c) a deep draw energy profile.

16. Method as recited in claim 13, wherein the simulation of the plurality of stations and the at least one transfer device includes a simulation of a dynamical model of the servo press, taking into account moving masses and corresponding inertia and a maximum slide velocity.

17. Method as recited in claim 13, wherein the simulation of the plurality of stations and the at least one transfer device includes a simulation of an electrical model of the servo press, taking into account a maximum motor velocity, a maximum torque, a maximum current and/or power consumption.

18. Method as recited in claim 13, wherein the information on the candidate servo press trajectory comprises at least one parameter for adjusting the candidate servo press trajectory, wherein the parameter affects the trajectory in such a way that a deep draw velocity profile is unchanged.

19. Method as recited in claim 13, wherein the simulation of the plurality of stations and the at least one transfer device comprises a simulation of energy management involving the plurality of stations and/or the at least one transfer device.

20. Method as recited in claim 19, wherein the multiple station press comprises a plurality of servo presses and wherein the simulation of energy management involves the plurality of servo presses.

21. Method as recited in claim 20, further comprising the step of generating a progression of current values for controlling operation of the servo press, based on the simulation of the servo press and preferably the at least one transfer device.

22. Method as recited in claim 1, further comprising the step of performing an optimisation process for determination of a workpiece transport trajectory minimising a total stress on the plurality of stations and the at least one transfer device.

23. A non-transitory computer readable medium having stored thereon instructions for the determination of workpiece transport trajectories for implementing a method according to claim 1 when executed by a processor.

24. Arrangement comprising
a) a multiple station press,
b) at least one transfer device for transporting the workpiece from a first of the plurality of stations to a second of the plurality of stations
c) a controller for the transfer device, wherein the controller
accepts and stores a set of constraints for the workpiece transport trajectories, the constraints comprising at least pickup and deposit positions for the workpiece in a plurality of stations of the multiple station press,
accepts and stores machine properties of the plurality of stations and of the at least one transfer device,
accepts and stores information on a candidate workpiece transport trajectory,
wherein
the controller is adapted to simulate the plurality of stations and the at least one transfer device based on the stored information for determining whether the candidate workpiece transport trajectory conforms with the stored machine parameters, such that it is physically possible to transport the workpiece along the trajectory;
the arrangement further comprises means for displaying the result of the determination:
the workpiece transport trajectories and the candidate workpiece transport trajectory are parameterized by a plurality of positions of a plurality of axes as a function of an angle parameter;
the workpiece transport trajectories and the candidate workpiece transport trajectory are partitioned into a plurality of segments, each of the segments including the axes positions for a continuous range of values of the angle parameter; and wherein
the information on the candidate workpiece transport trajectory comprises a set of motional information and values of angle parameters relating to transitions between neighbouring segments of a set of segments of a trajectory template, the motional information at least comprising velocity information.

25. Method as recited in claim 13, wherein the machine properties of the plurality of stations comprise information on a maximum power consumption allowed for the servo press.

* * * * *